US009054679B2

(12) United States Patent
Fujita

(10) Patent No.: US 9,054,679 B2
(45) Date of Patent: Jun. 9, 2015

(54) FLIP-FLOP CIRCUIT AND SEMICONDUCTOR DEVICE

(71) Applicant: Semiconductor Energy Laboratory Co., Ltd., Kanagawa-ken (JP)

(72) Inventor: Masashi Fujita, Tokyo (JP)

(73) Assignee: SEMICONDUCTOR ENERGY LABORATORY CO., LTD., Kanagawa-Ken (JP)

( * ) Notice: Subject to any disclaimer, the term of this patent is extended or adjusted under 35 U.S.C. 154(b) by 88 days.

(21) Appl. No.: 14/022,551

(22) Filed: Sep. 10, 2013

(65) Prior Publication Data

US 2014/0070861 A1    Mar. 13, 2014

(30) Foreign Application Priority Data

Sep. 11, 2012  (JP) ................................. 2012-199419

(51) Int. Cl.
| H03K 3/289 | (2006.01) |
| H03K 3/012 | (2006.01) |
| H03K 3/037 | (2006.01) |
| H03K 3/3562 | (2006.01) |
| H03K 3/356 | (2006.01) |

(52) U.S. Cl.
CPC ............. *H03K 3/012* (2013.01); *H03K 3/0375* (2013.01); *H03K 3/35625* (2013.01); *H03K 3/356156* (2013.01)

(58) Field of Classification Search
USPC .......................... 327/202, 203, 208–212, 218
See application file for complete search history.

(56) References Cited

U.S. PATENT DOCUMENTS

| 5,497,114 | A | 3/1996 | Shimozono et al. |
| 5,994,935 | A * | 11/1999 | Ueda et al. ................... 327/202 |
| 7,405,606 | B2 * | 7/2008 | Kok et al. ...................... 327/202 |
| 8,143,929 | B2 * | 3/2012 | Ramaraju et al. ............. 327/202 |
| 8,542,048 | B2 * | 9/2013 | Ramaraju ...................... 327/202 |
| 2011/0199139 | A1 * | 8/2011 | Arora et al. ................... 327/203 |
| 2011/0260764 | A1 * | 10/2011 | Kitahara et al. ............. 327/202 |
| 2012/0250407 | A1 | 10/2012 | Kurokawa |
| 2012/0257440 | A1 | 10/2012 | Takemura |
| 2012/0262982 | A1 | 10/2012 | Takemura |
| 2012/0262983 | A1 | 10/2012 | Kobayashi |
| 2012/0286823 | A1 | 11/2012 | Yoneda |
| 2012/0287701 | A1 | 11/2012 | Takemura |
| 2012/0287702 | A1 | 11/2012 | Fujita |
| 2012/0294069 | A1 | 11/2012 | Ohmaru et al. |
| 2012/0294102 | A1 | 11/2012 | Ishizu |
| 2012/0299626 | A1 | 11/2012 | Fujita et al. |
| 2012/0320663 | A1 | 12/2012 | Kimura et al. |
| 2013/0082760 | A1 | 4/2013 | Umezaki |
| 2013/0083588 | A1 | 4/2013 | Takemura |
| 2014/0125392 | A1 * | 5/2014 | Javerliac et al. ............. 327/202 |

FOREIGN PATENT DOCUMENTS

JP    2007-272953    10/2007

* cited by examiner

*Primary Examiner* — Tuan T Lam
(74) *Attorney, Agent, or Firm* — Husch Blackwell LLP

(57) ABSTRACT

A flip-flop circuit consuming lower power than a conventional flip-flop circuit is provided. Further, a flip-flop circuit having a smaller number of transistors than a conventional flip-flop circuit to have a reduced footprint is provided. An n-channel transistor is used as a transistor which is to be turned on at a high level potential and a p-channel transistor is used as a transistor which is to be turned on at a low level potential, whereby the flip-flop circuit can operate only with a clock signal and without an inverted signal of the clock signal, and the number of transistors that operate only with a clock signal in the flip-flop circuit can be reduced.

18 Claims, 15 Drawing Sheets

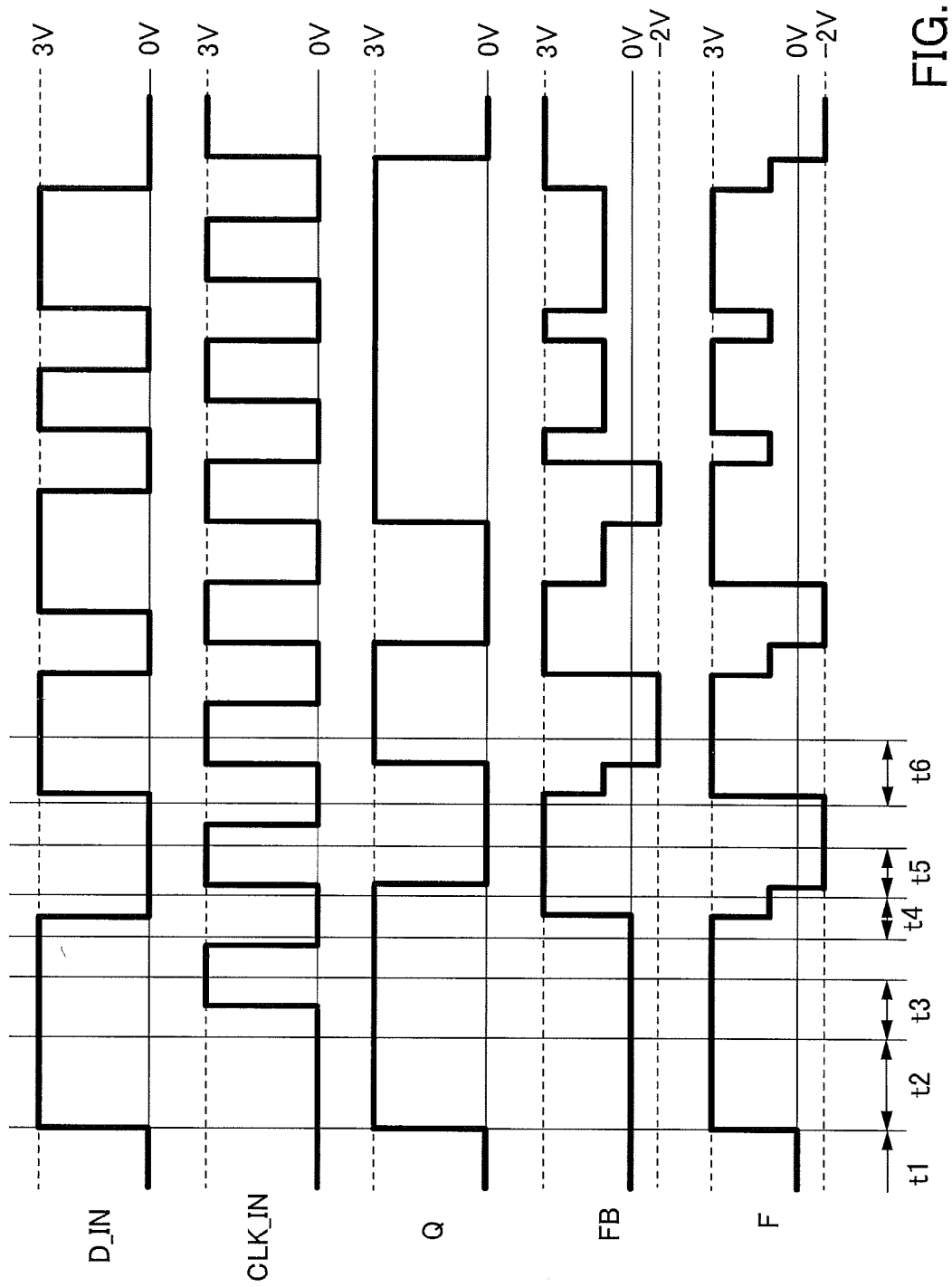

FLIP-FLOP CIRCUIT AND SEMICONDUCTOR DEVICE

BACKGROUND OF THE INVENTION

1. Field of the Invention

The present invention relates to a flip-flop circuit. The present invention also relates to a semiconductor device including the flip-flop circuit. Note that in this specification, a semiconductor device refers to a semiconductor element itself or a device including a semiconductor element.

2. Description of the Related Art

A flip-flop circuit is a circuit that can temporarily hold a specific logic state (hereinafter also referred to as data), and is used in a variety of semiconductor devices. For example, a flip-flop circuit is used as a circuit that temporarily holds data when the data is written or read to/from a storage circuit provided in a semiconductor device.

There are a variety of configurations of the flip-flop circuit described above; for example, a D flip-flop circuit illustrated in FIG. 11A is known.

The D flip-flop circuit illustrated in FIG. 11A includes an inverter 10, a transfer gate 12, a clocked inverter 14, an inverter 20, and an inverter 22. In FIG. 11A, "CLK_IN" and "CLKB_IN" represent a clock signal and an inverted signal of a clock signal, respectively. A clock signal CLK is input to the inverter 20, and the inverter 20 outputs the inverted signal CLKB_IN of the clock signal CLK. The inverted signal CLKB_IN of the clock signal CLK is input to the inverter 22, and the inverter 22 outputs the clock signal CLK_IN. The clock signal CLK_IN and the inverted signal CLKB_IN of the clock signal CLK are input to the transfer gate 12 and the clocked inverter 14.

FIG. 11B illustrates the configuration of the inverter 10, the inverter 20 and the inverter 22, FIG. 11C illustrates the configuration of the transfer gate 12, and FIG. 11D illustrates the configuration of the clocked inverter 14. The D flip-flop circuit illustrated in FIG. 11A includes 5 inverters, 2 transfer gates, and 2 clocked inverters, and thus is composed of 22 transistors ((2×5)+(2×2)+(4×2)) in total (see Patent Document 1).

REFERENCE

Patent Document

[Patent Document 1] Japanese Published Patent Application No. 2007-272953.

SUMMARY OF THE INVENTION

In the whole D flip-flop circuit, 12 out of the 22 transistors (2 transistors in each of the 2 inverters for generating the clock signal CLK_IN (or the inverted signal CLKB_IN of the clock signal CLK), 2 transistors in each of the 2 transfer gates, and 2 transistors in each of the 2 clocked inverter) operate with a clock signal or an inverted signal of the clock signal. In a semiconductor device including the D flip-flop circuit, a clock signal and an inverted signal of the clock signal keep being sent while a power is on, which increases power consumption of the whole semiconductor device.

Further, since the D flip-flop circuit includes 22 transistors, in the case where the D flip-flop circuit is used as a register of a central processing unit (CPU), for example, the chip area of the CPU is increased.

In view of the above, an object of one embodiment of the present invention is to provide a flip-flop circuit consuming lower power than a conventional flip-flop circuit.

Another object of one embodiment of the present invention is to provide a flip-flop circuit having a smaller number of transistors than a conventional flip-flop circuit to have a reduced footprint.

Focusing on the polarity of a transistor, an n-channel transistor is used as a transistor which is to be turned on at a high level potential and a p-channel transistor is used as a transistor which is to be turned on at a low level potential, whereby the flip-flop circuit can operate only with a clock signal and without an inverted signal of the clock signal, and the number of transistors that operate only with a clock signal in the flip-flop circuit can be reduced.

One embodiment of the present invention is a flip-flop circuit including a first input terminal, a second input terminal, a first inverter, a second inverter, a third inverter, a fourth inverter, a fifth inverter, a first transistor, a second transistor, a third transistor, a fourth transistor, a fifth transistor, and an output terminal. The first input terminal is electrically connected to an input terminal of the first inverter. An output terminal of the first inverter is electrically connected to an input terminal of the second inverter and one of a source and a drain of the second transistor. An output terminal of the second inverter is electrically connected to one of a source and a drain of the first transistor. The other of the source and the drain of the first transistor is electrically connected to a gate of the fourth transistor. The other of the source and the drain of the second transistor is electrically connected to a gate of the fifth transistor. One of a source and a drain of the third transistor is electrically connected to a high potential power supply line. The other of the source and the drain of the third transistor is electrically connected to one of a source and a drain of the fourth transistor and one of a source and a drain of the fifth transistor. The other of the source and the drain of the fourth transistor is electrically connected to an input terminal of the third inverter and an output terminal of the fourth inverter. The other of the source and the drain of the fifth transistor is electrically connected to the output terminal, an output terminal of the third inverter, and an input terminal of the fourth inverter. The second input terminal is electrically connected to an input terminal of the fifth inverter. An output terminal of the fifth inverter is electrically connected to a gate of the first transistor, a gate of the second transistor, and a gate of the third transistor.

In another embodiment of the present invention having the above structure, a polarity of the third transistor is different from polarities of the first transistor, the second transistor, the fourth transistor, and the fifth transistor.

In another embodiment of the present invention having the above structure, the third transistor is a p-channel transistor.

Another embodiment of the present invention is a flip-flop circuit including a first input terminal, a second input a first inverter, a second inverter, a third inverter, a fourth inverter, a fifth inverter, a first transistor, a second transistor, a third transistor, a fourth transistor, a fifth transistor, and an output terminal. The first input terminal is electrically connected to an input terminal of the first inverter. An output terminal of the first inverter is electrically connected to an input terminal of the second inverter and one of a source and a drain of the second transistor. An output terminal of the second inverter is electrically connected to one of a source and a drain of the first transistor. The other of the source and the drain of the first transistor is electrically connected to a gate of the fourth transistor. The other of the source and the drain of the second transistor is electrically connected to a gate of the fifth transistor. One of a source and a drain of the fourth transistor is electrically connected to one of a source and a drain of the third transistor and one of a source and a drain of the fifth transistor. The other of the source and the drain of the third transistor is electrically connected to a low potential power supply line. The other of the source and the drain of the fourth transistor is electrically connected to an input terminal of the third inverter and an output terminal of the fourth inverter. The other of the source and the drain of the fifth transistor is electrically connected to the output terminal, an output terminal of the third inverter, and an input terminal of the fourth inverter. The second input terminal is electrically connected to an input terminal of the fifth inverter. An output terminal of the fifth inverter is electrically connected to a gate of the first transistor, a gate of the second transistor, and a gate of the third transistor.

In another embodiment of the present invention having the above structure, a polarity of the third transistor is different from polarities of the first transistor, the second transistor, the fourth transistor, and the fifth transistor.

In another embodiment of the present invention having the above structure, the third transistor is an n-channel transistor.

In another embodiment of the present invention having the above structure, each of the first transistor and the second transistor is preferably a transistor including an oxide semiconductor in a channel region.

Another embodiment of the present invention is a semiconductor device including a flip-flop circuit having the above structure.

One embodiment of the present invention enables the number of transistors that operate with a clock signal or an inverted signal of the clock signal to be smaller in a flip-flop circuit of one embodiment of the present invention than that in a conventional flip-flop circuit; thus, power consumption of the whole flip-flop circuit can be reduced.

Further, one embodiment of the present invention enables the total number of transistors to be smaller in a flip-flop circuit of one embodiment of the present invention than that in a conventional flip-flop circuit, so that the footprint of the flip-flop circuit can be reduced.

BRIEF DESCRIPTION OF THE DRAWINGS

FIG. 7 is a timing chart illustrating an operation of a flip-flop circuit in another embodiment of the present invention.

DETAILED DESCRIPTION OF THE INVENTION

Figure 1:
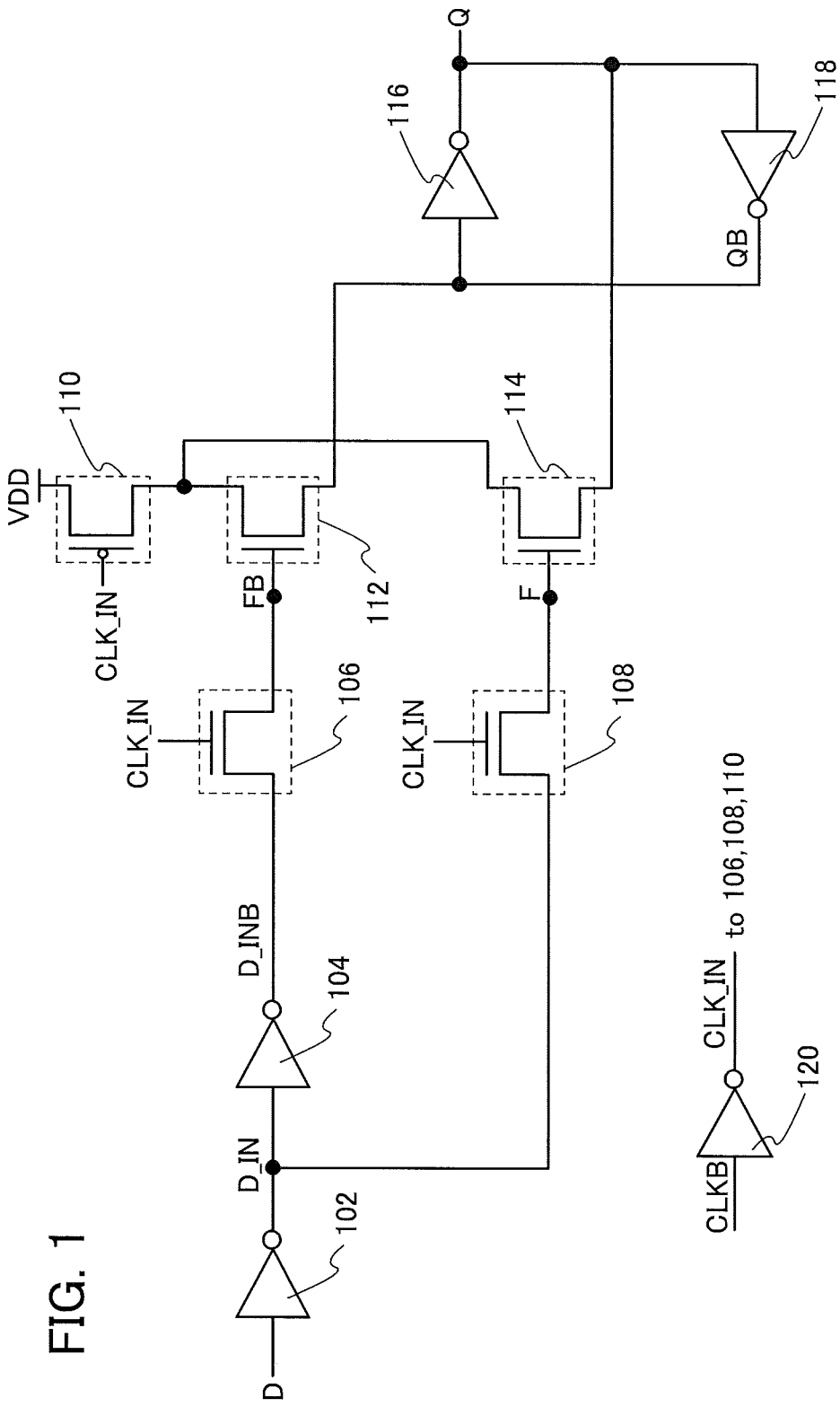
FIG. 1 illustrates a flip-flop circuit in one embodiment of the present invention.

Hereinafter, embodiments of the present invention will be described in detail with reference to the accompanying drawings. Note that the present invention is not limited to the description below, and it is easily understood by those skilled in the art that a variety of changes and modifications can be made without departing from the spirit and scope of the present invention. Accordingly, the present invention should not be construed as being limited to the description of the embodiments below.

Note that the functions of a "source" and a "drain" may replace each other in the case, where transistors of opposite polarities are used, or in the case where the direction of a current flow changes in a circuit operation, for example. Thus, the terms "source" and "drain" can replace each other in this specification.

The term "electrically connected" includes the case where components are connected through an "object having any electric function". There is no particular limitation on the "object having any electric function" as long as electric signals can be transmitted and received between the components connected through the object.

The position, size, range, or the like of each component illustrated in drawings and the like is not accurately represented in some cases for easy understanding. Thus, the disclosed invention is not necessarily limited to the position, size, range, and the like in the drawings and the like.

The ordinal number such as "first", "second", and "third" are used to avoid confusion among components.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

Embodiment 1

In this embodiment, a flip-flop circuit in one embodiment of the present invention will be described with reference to drawings.

<Example of Circuit Configuration>

FIG. 1 is a circuit diagram of a flip-flop circuit 100 in one embodiment of the present invention.

In the flip-flop circuit 100 illustrated in FIG. 1, an input terminal to which a data signal D is input is electrically connected to an input terminal of an inverter 102, and an output terminal of the inverter 102 is electrically connected to an input terminal of an inverter 104 and one of a source and a drain of a transistor 108. A signal input to this wiring is denoted by D_IN. An output terminal of the inverter 104 is electrically connected to one of a source and a drain of a transistor 106. A signal input to this wiring is denoted by D_INB. The other of the source and the drain of the transistor 106 is electrically connected to a gate of a transistor 112. The other of the source and the drain of the transistor 108 is electrically connected to a gate of a transistor 114. One of a source and a drain of a transistor 110 is electrically connected to a high potential power supply line VDD.

The other of the source and the drain of the transistor 110 is electrically connected to one of a source and a drain of the transistor 112 and one of a source and a drain of the transistor 114. The other of the source and the drain of the transistor 112 is electrically connected to an input terminal of an inverter 116 and an output terminal of an inverter 118. The other of the source and the drain of the transistor 114 is electrically connected to an output terminal from which a signal Q is output, an output terminal of the inverter 116, and an input terminal of the inverter 118. An input terminal to which an inverted signal CLKB of a clock signal is input is electrically connected to an input terminal of an inverter 120. A clock signal CLK_IN is input to gates of the transistors 106, 108, and 110 from an output terminal of the inverter 120.

The transistors 106, 108, 112, and 114 are n-channel transistors and the transistor 110 is a p-channel transistor.

Each of the inverters in the flip-flop circuit 100 is connected to a high potential power supply line VDD for supplying a high potential and a low potential power supply line VSS for supplying a low potential (not illustrated). Note that the inverter may have a circuit configuration in which, for example, a p-channel transistor and an n-channel transistor are used in combination.

The clock signal CLK_IN oscillates between a high level and a low level only during a processing period.

Note that in this embodiment, high level voltage is higher than or equal to 2 V and low level voltage is lower than or equal to 0 V.

The data signal D is a signal input to the flip-flop circuit 100 as data.

From the flip-flop circuit 100, data of the data signal D is output as the signal Q at the timing when the clock signal CLK_IN falls.

<Example of Circuit Operation>

Figure 2:
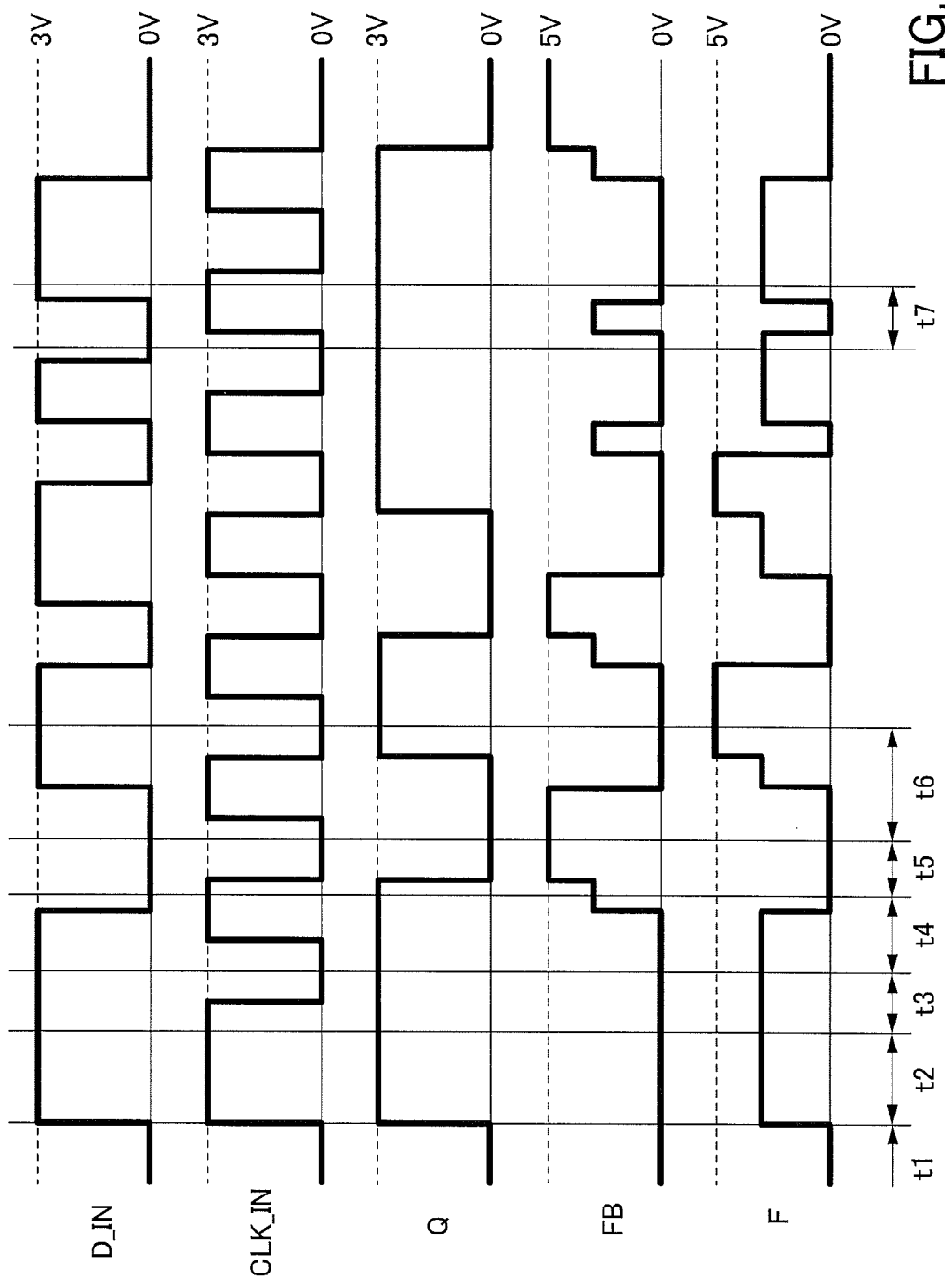
FIG. 2 is a timing chart illustrating an operation of a flip-flop circuit in one embodiment of the present invention.

Next, an operation of the flip-flop circuit 100 is described with reference to FIG. 2, FIGS. 3A and 3B, FIGS. 4A and 4B, and FIGS. 5A and 5B. FIG. 2 is a timing chart illustrating the operation of the flip-flop circuit 100. FIGS. 3A and 3B, FIGS. 4A and 4B, and FIGS. 5A and 5B illustrate the operation of the flip-flop circuit 100. Note that a non-operation state of a transistor is represented by a cross mark (x) in the drawings and the potential of each node (a high level potential or a low level potential) is represented by "H" or "L" in the drawings.

Here, the timing chart in FIG. 2 is described. FIG. 2 illustrates seven periods t1 to t7. The period t1 is an off period, the period t2 is a starting period, and the periods t3 to t7 are processing periods.

Figure 3A:
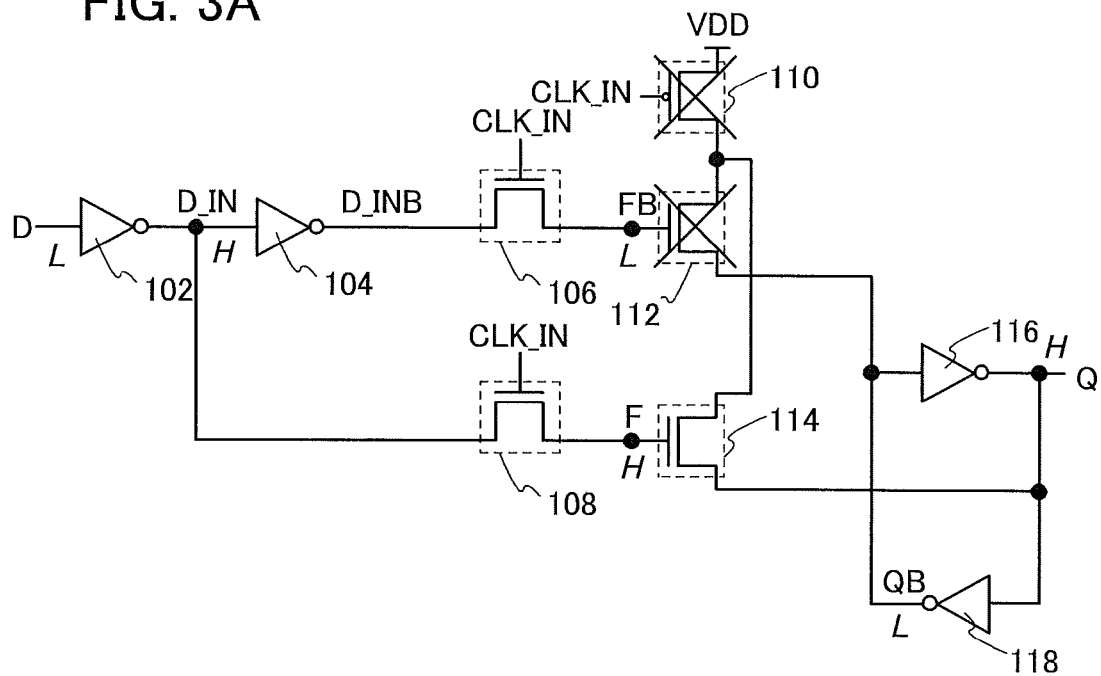
FIGS. 3A and 3B illustrate an operation of a flip-flop circuit in one embodiment of the present invention.
Figure 3B:
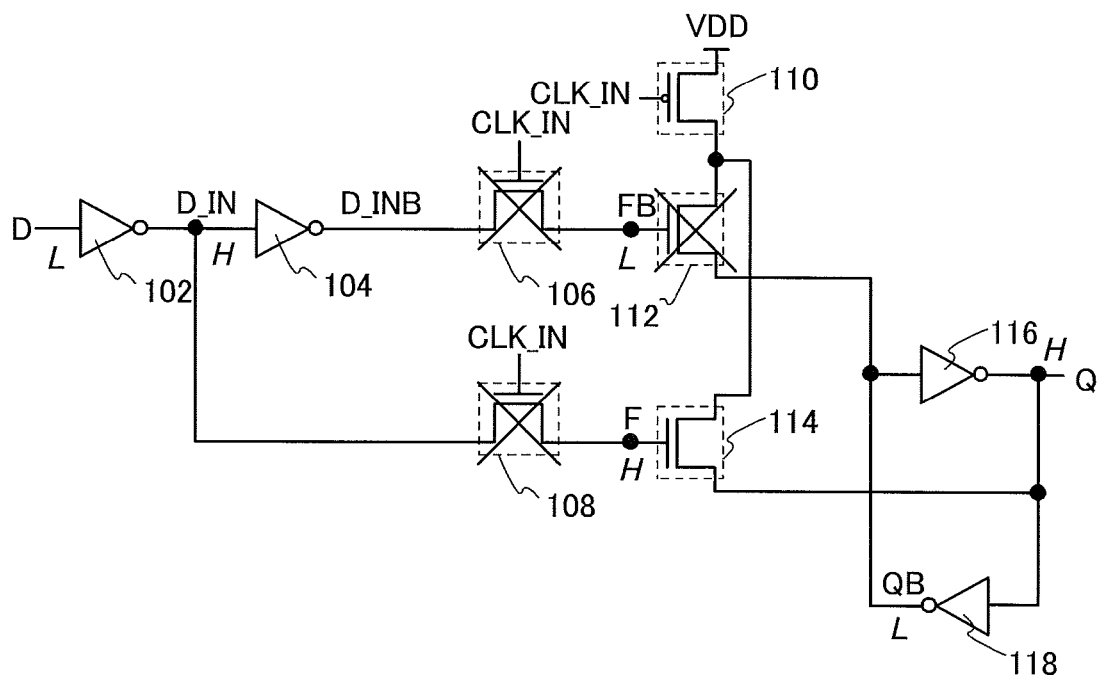
Figure 4A:
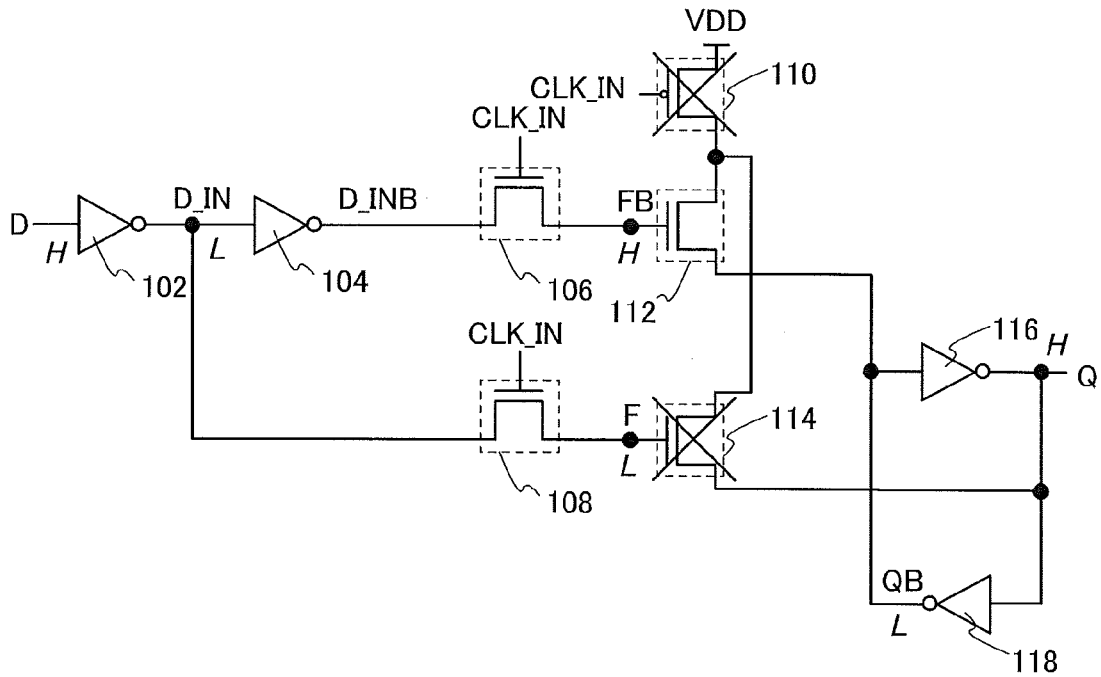
FIGS. 4A and 4B illustrate an operation of a flip-flop circuit in one embodiment of the present invention.
Figure 4B:
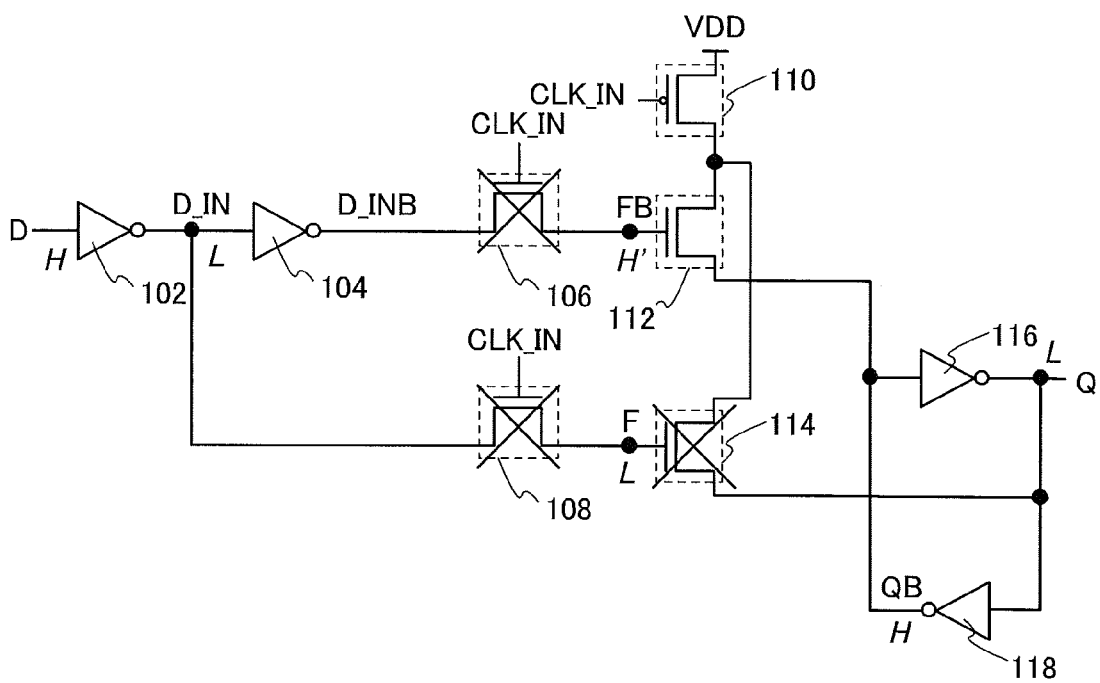
Figure 5A:
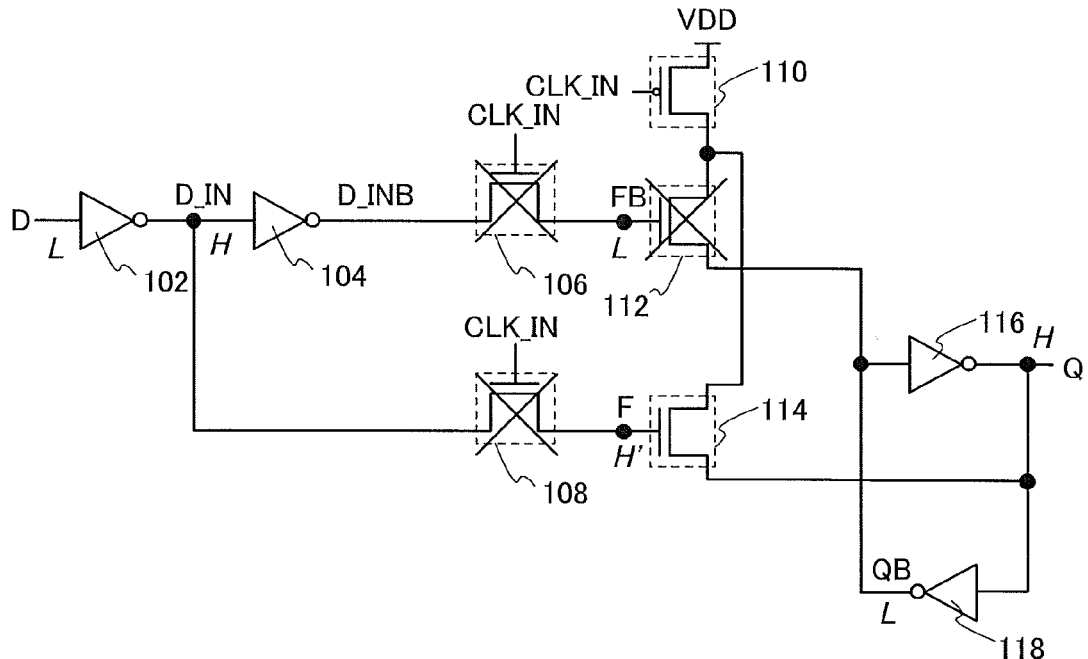
FIGS. 5A and 5B illustrate an operation of a flip-flop circuit in one embodiment of the present invention.
Figure 5B:
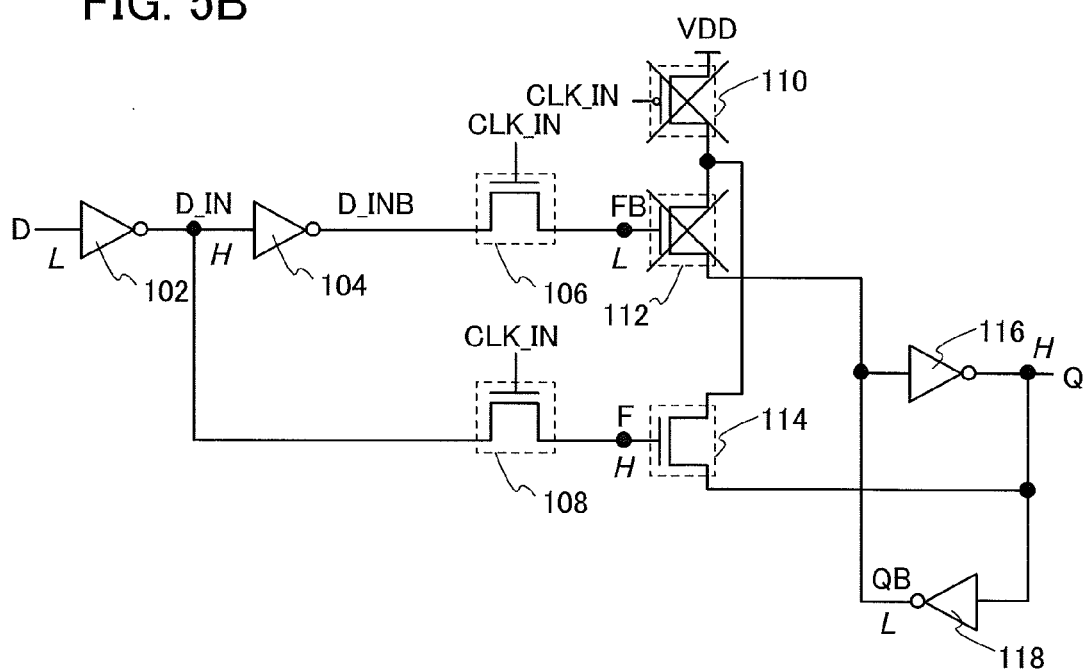

First, the flip-flop circuit 100 is switched from an off state (period t1) to an on state (period t2) (see FIG. 3A).

At this time, the data signal D and the inverted signal CLKB of the clock signal are at a low level. When the flip-flop circuit 100 is turned on in this state, a high potential is supplied from the high potential power supply line VDD and the clock signal CLK_IN becomes a high level; accordingly, the transistor 106 and the transistor 108 are turned on and the transistor 110 is turned off.

Further, when a high potential is supplied from the high potential power supply line VDD, the signal D_IN becomes a high level and the signal D_INB becomes a low level. Since the transistor 106 and the transistor 108 are on, the potential of a node F becomes a high level and the potential of a node FB becomes a low level. Accordingly, the transistor 112 is turned off and the transistor 114 is turned on. In the case of the configuration in FIG. 1, the high level potential of the node F (the node FB) is actually lower than the high potential by the threshold voltage of the transistor 108 (the transistor 106). Note that in this embodiment, the threshold voltage of the transistor 108 (the transistor 106) is lower than 1 V.

On the other hand, the transistor 110 is off. In an initial state, a high level signal is output as the signal Q. Note that a configuration can be employed in which the inverter 116 is replaced with a NAND gate, one of its input terminals is connected to a terminal to which a reset signal is input, and the other of the input terminals is connected to a node QB, which is a node of a wiring to which a signal QB is input. With such a configuration, the signal Q can be forcibly at a high level in the initial state when the reset signal is set to a low level. Alternatively, a configuration can be employed in which the inverter 118 is replaced with a NOR gate, one of its input terminals is connected to a terminal to which a reset signal is input, and the other of the input terminals is connected to a node Q, which is a node of a wiring to which the signal Q is input. With such a configuration, the signal Q can be forcibly at a high level in the initial state when the reset signal is set to a high level. When the reset signal input to the NAND gate is at a high level, the NAND gate operates in a manner similar to that of the inverter 116 and outputs an inverted signal of the signal at the node QB. When the reset signal input to the NOR gate is at a low level, the NOR gate operates in a manner similar to that of the inverter 118 and outputs an inverted signal of the signal at the node Q.

Note that when the signal Q is at a low level in the initial state, the inverter 116 may be replaced with a NOR gate and a high level reset signal may be input to the NOR gate, so that the signal Q is forcibly at a low level in the initial state. Alternatively, the inverter 118 may be replaced with a NAND gate and a low level reset signal may be input to the NAND gate, so that the signal Q is forcibly at a low level in the initial state.

Next, in the period t3 in the processing period, the clock signal CLK_IN is changed from a high level to a low level, so that the transistor 106 and the transistor 108 are turned off and the transistor 110 is turned on.

When the transistor 110 is turned on, current flows from the high potential power supply line VDD through the transistor 114, and a high potential (high level potential) is supplied to the input terminal of the inverter 118. Since a high level potential has been input to the input terminal of the inverter 118, the level of the input terminal of the inverter 118 is not changed here. Thus, the signal QB which is output from the inverter 118 is kept at a low level, and the signal Q which is output from the inverter 116 is kept at a high level (see FIG. 3B).

Next, in the period t4 in the processing period, the clock signal CLK_IN is changed from a low level to a high level, so that the transistor 106 and the transistor 108 are turned on and the transistor 110 is turned off.

After that, the signal D_IN is changed from a high level to a low level. At this time, the potential of the node FB becomes a high level owing to the inverter 104, and the potential of the node F becomes a low level. Accordingly, the transistor 112 is turned on and the transistor 114 is turned off. Since the transistor 110 is off, the signal Q (high level) and the inverted signal QB (low level) of the signal Q are not changed (see FIG. 4A).

Then, in the period t5 in the processing period, the clock signal CLK_IN is changed from a high level to a low level, so that the transistor 106 and the transistor 108 are turned off and the transistor 110 is turned on.

When the transistor 110 is turned on, current flows from the high potential power supply line VDD to the input terminal of the inverter 116 through the transistor 112, and the potential of the input terminal of the inverter 116 is changed to a high level. When a high level potential is input to the input terminal of the inverter 116, the signal Q at a low level is output from the output terminal of the inverter 116 (see FIG. 4B).

The transistor 106 is off and the node FB is in a floating state when the signal QB, which is the inverted signal of the signal Q, is changed from a low level to a high level; thus, the potential of the node FB becomes higher than the high potential (3 V) (the voltage is 5 V here, and denoted by H' in the drawing) with the gate capacitance of the transistor 112 by an influence of a change in the signal QB from a low level to a high level. As described above, the higher the potential of the node FB becomes, the higher the voltage can be applied to the gate of the transistor 112; thus, a larger amount of current can flow from the high potential power supply line VDD to the input terminal of the inverter 116. As a result, the signal QB can be surely changed from a low level to a high level.

Next, in the period t6 in the processing period, the clock signal CLK_IN is changed from a low level to a high level, so that the transistor 106 and the transistor 108 are turned on and the transistor 110 is turned off. After that, the signal D_IN is changed from a low level to a high level. At this time, the potential of the node FB becomes a low level owing to the inverter 104, and the potential of the node F becomes a high level. Further, the clock signal CLK_IN is changed from a high level to a low level, so that the transistor 106 and the transistor 108 are turned off and the transistor 110 is turned on (see FIG. 5A).

When the transistor 110 is turned on, current flows from the high potential power supply line VDD to the input terminal of the inverter 118 through the transistor 114, and the potential of the input terminal of the inverter 118 is changed to a high level. Then, the signal QB at a low level is output from the output terminal of the inverter 118. The signal QB is then input to the input terminal of the inverter 116, and the signal Q at a high level is output from the output terminal of the inverter 116.

The transistor 108 is off and the node F is in a floating state when the signal Q is changed from a low level to a high level; thus, the potential of the node F becomes voltage higher than the high potential (3 V) (the voltage is 5 V here, and denoted by H' in the drawing) with the gate capacitance of the transistor 114 by an influence of a change in the signal Q from a low level to a high level. The higher the potential of the node F becomes as described above, the higher the voltage can be applied to the gate of the transistor 114; thus, a larger amount of current can flow from the high potential power supply line VDD to the input terminal of the inverter 118. As a result, the signal Q can be surely changed from a low level to a high level.

Next, in the period t7 in the processing period, the clock signal CLK_IN is changed from a low level to a high level, so that the transistor 106 and the transistor 108 are turned on and the transistor 110 is turned off. Since the signal D_IN is at a low level, the potential of the node FB becomes a high level owing to the inverter 104 and the potential of the node F becomes a low level. After that, the signal D_IN is changed from a low level to a high level. At this time, the potential of the node FB becomes a low level owing to the inverter 104, and the potential of the node F becomes a high level (see FIG. 5B). Since the transistor 110 is off, the signal Q (signal QB) is kept at a high (low) level.

With such a configuration, the flip-flop circuit 100 in this embodiment can operate without the inverted signal of the clock signal CLK_IN. The flip-flop circuit 100 in this embodiment operates only with the clock signal CLK_IN and the number of transistors that operate only with the clock signal CLK_IN is reduced. Thus, the area occupied by the flip-flop circuit can be reduced. In addition, since the number of transistors, in particular, the number of transistors that operate with the clock signal CLK_IN can be reduced, power consumption of the whole flip-flop circuit can be reduced.

In general, a level shifter is necessary to send a signal from a circuit which operates with low power supply voltage to a circuit which operates with high power supply voltage.

Figure 13:
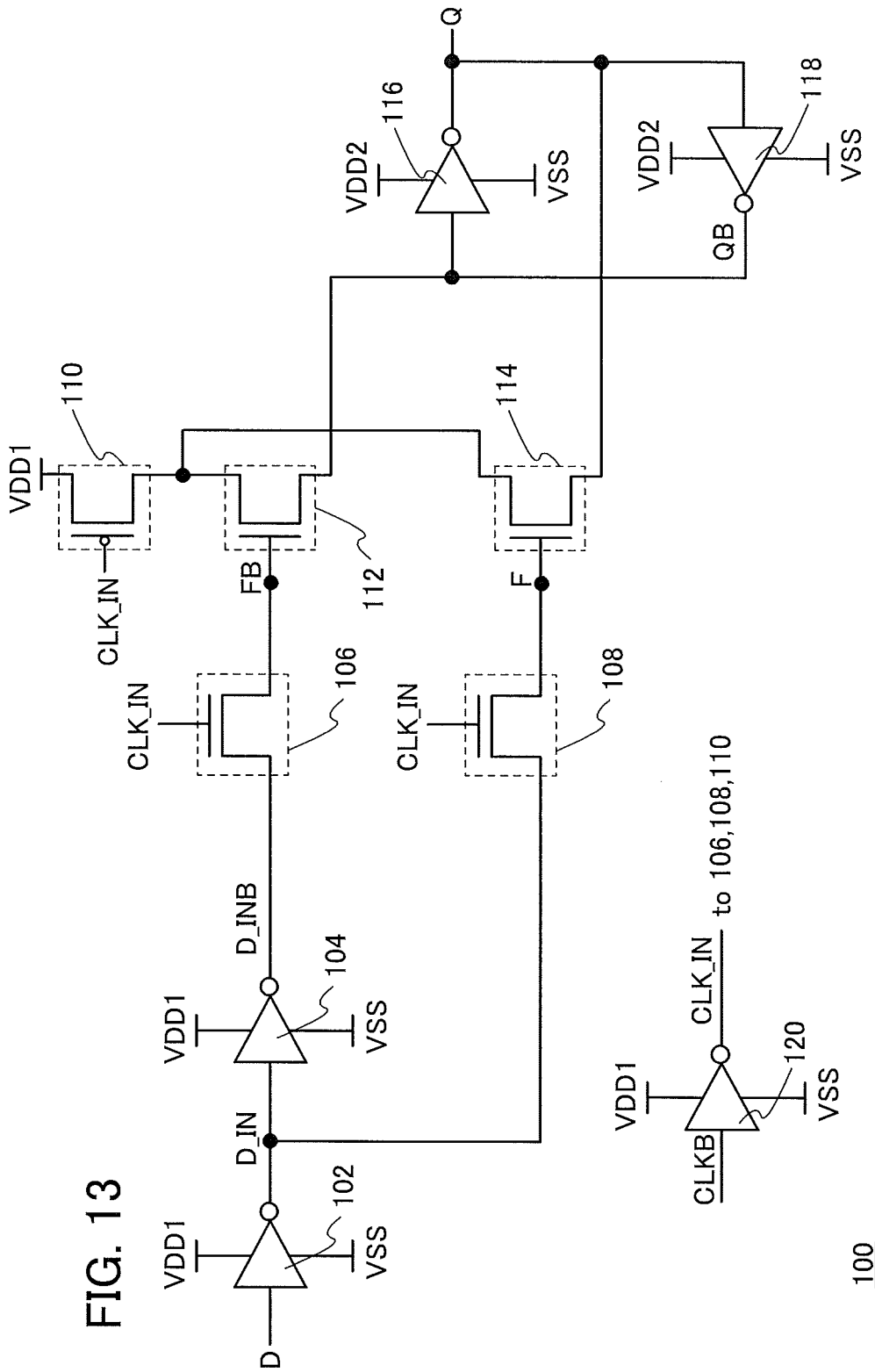
FIG. 13 illustrates a flip-flop circuit in one embodiment of the present invention.

However, in the flip-flop circuit 100 in this embodiment, as illustrated in FIG. 13, there are two kinds of high potential power supply line: high potential power supply lines VDD1 connected to the inverter 102, the inverter 104, the inverter 120, and one of the source and the drain of the transistor 110; and high potential power supply lines VDD2 connected to the inverter 116 and the inverter 118. In the case where the voltage applied to the high potential power supply line VDD1 is lower than the voltage applied to the high potential power supply line VDD2, the voltage of the node FB and the voltage of the node F are higher than that of the high potential power supply line VDD 1. With the use of the high voltage, the flip-flop circuit 100 can serve as a level shifter, so that the inverter 116 and the inverter 118 can operate (note that the voltage applied to the high potential power supply line VDD2 is higher than the voltage applied to the high potential power supply line VDD1 and is in the range up to the maximum values of the voltage of the node FB and the voltage of the node F).

According to the above, a level shifter does not need to be provided even in the case where a signal is sent from a circuit which operates with low power supply voltage to a circuit which operates with high power supply voltage; thus, a simple circuit and a reduced footprint can be obtained.

The structure, method, and the like in this embodiment can be combined as appropriate with any of the structures, methods, and the like in the other embodiments.

Embodiment 2

In this embodiment, a flip-flop circuit in another embodiment of the present invention will be described with reference to drawings.

<Example of Circuit Configuration>

Figure 6:
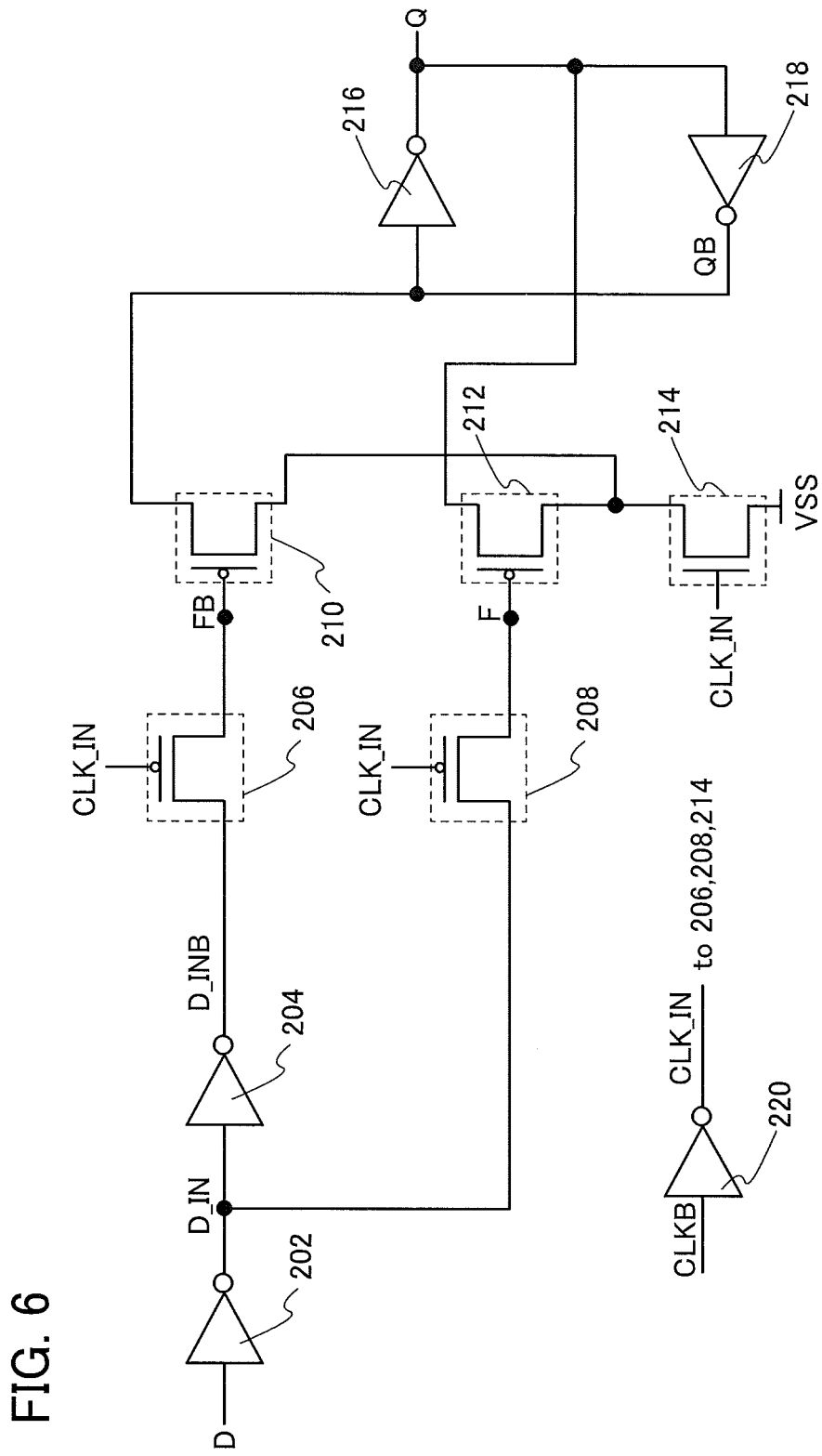
FIG. 6 illustrates a flip-flop circuit in another embodiment of the present invention.

FIG. 6 is a circuit diagram of a flip-flop circuit 200 in one embodiment of the present invention.

In the flip-flop circuit 200 illustrated in FIG. 6, an input terminal to which a data signal D is input is electrically connected to an input terminal of an inverter 202, and an output terminal of the inverter 202 is electrically connected to an input terminal of an inverter 204 and one of a source and a drain of a transistor 208. A signal input to this wiring is denoted by D_IN. An output terminal of the inverter 204 is electrically connected to one of a source and a drain of a transistor 206. A signal input to this wiring is denoted by D_INB. The other of the source and the drain of the transistor 206 is electrically connected to a gate of a transistor 210. The other of the source and the drain of the transistor 208 is electrically connected to a gate of a transistor 212. One of a source and a drain of the transistor 210 is electrically connected to one of a source and a drain of a transistor 214 and one of a source and a drain of the transistor 212.

The other of the source and the drain of the transistor 214 is electrically connected to a low potential power supply line VSS. The other of the source and the drain of the transistor 210 is electrically connected to an input terminal of an inverter 216 and an output terminal of an inverter 218. The other of the source and the drain of the transistor 212 is electrically connected to an output terminal from which a signal Q is output, an output terminal of the inverter 216, and an input terminal of the inverter 218. An input terminal to which an inverted signal CLKB of a clock signal is input is electrically connected to an input terminal of an inverter 220. A clock signal CLK_IN is input to gates of the transistors 206, 208, and 214 from an output terminal of the inverter 220.

The transistors 206, 208, 210, and 212 are p-channel transistors and the transistor 214 is an n-channel transistor.

Each of the inverters in the flip-flop circuit 200 is connected to a high potential power supply line VDD for supplying a high potential and a low potential power supply line VSS for supplying a low potential. Note that the inverter may have a circuit configuration in which, for example, a p-channel transistor and an n-channel transistor are used in combination.

The clock signal CLK_IN oscillates between a high level and a low level only during a processing period.

Note that in this embodiment, high level voltage is higher than or equal to 3 V and low level voltage is lower than or equal to 1 V.

The data signal D is a signal input to the flip-flop circuit 200 as data.

From the flip-flop circuit 200, data of the data signal D is output as the signal Q at the timing when the clock signal CLK_IN rises.

<Example of Circuit Operation>

Next, an operation of the flip-flop circuit 200 is described with reference to FIG. 7, FIGS. 8A and 8B, FIGS. 9A and 9B, and FIG. 10. FIG. 7 is a timing chart illustrating the operation of the flip-flop circuit 200. FIGS. 8A and 8B, FIGS. 9A and 9B, and FIG. 10 illustrate the operation of the flip-flop circuit 200. Note that a non-operation state of a transistor is represented by a cross mark (x) in the drawings and the potential of each node (a high level potential or a low level potential) is represented by "H" or "L" in the drawings.

Here, the timing chart in FIG. 7 is described. FIG. 7 illustrates six periods t1 to t6. The period t1 is an off period, the period t2 is a starting period, and the periods t3 to t6 are processing periods.

Figure 8A:
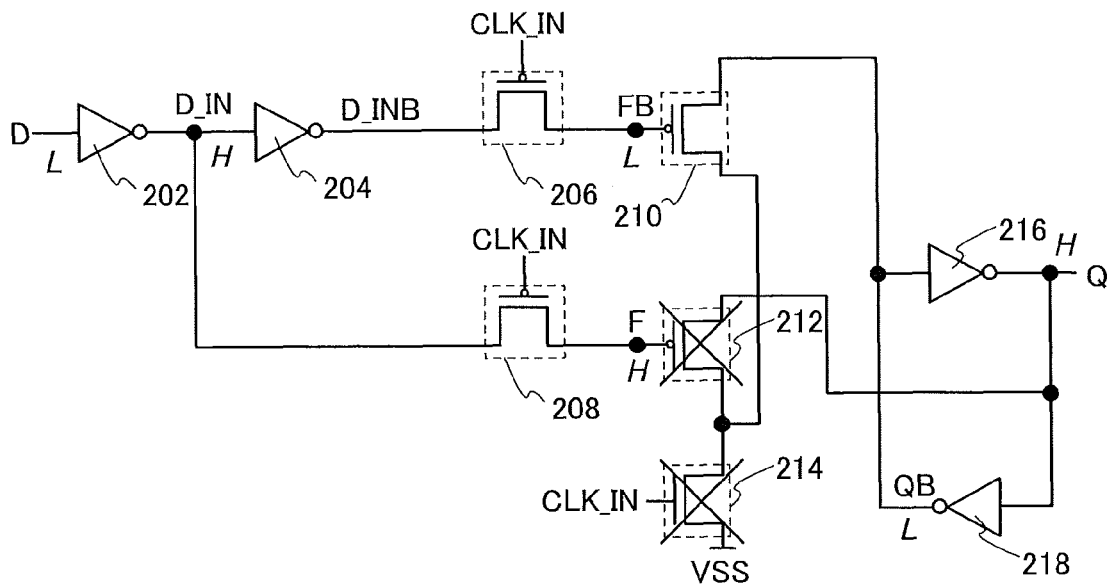
FIGS. 8A and 8B illustrate an operation of a flip-flop circuit in another embodiment of the present invention.
Figure 8B:
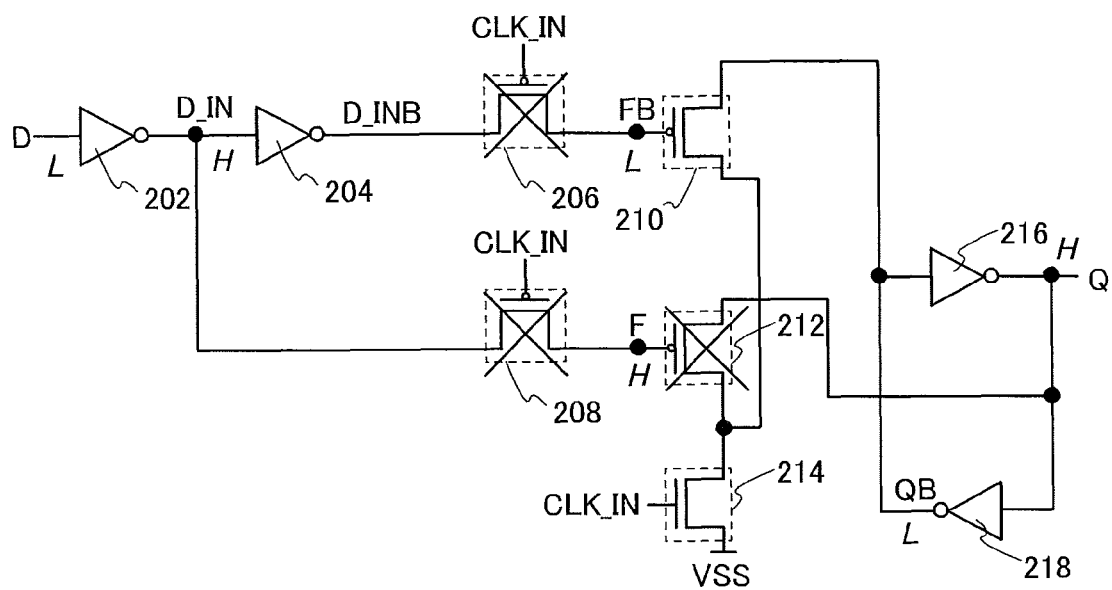
Figure 9A:
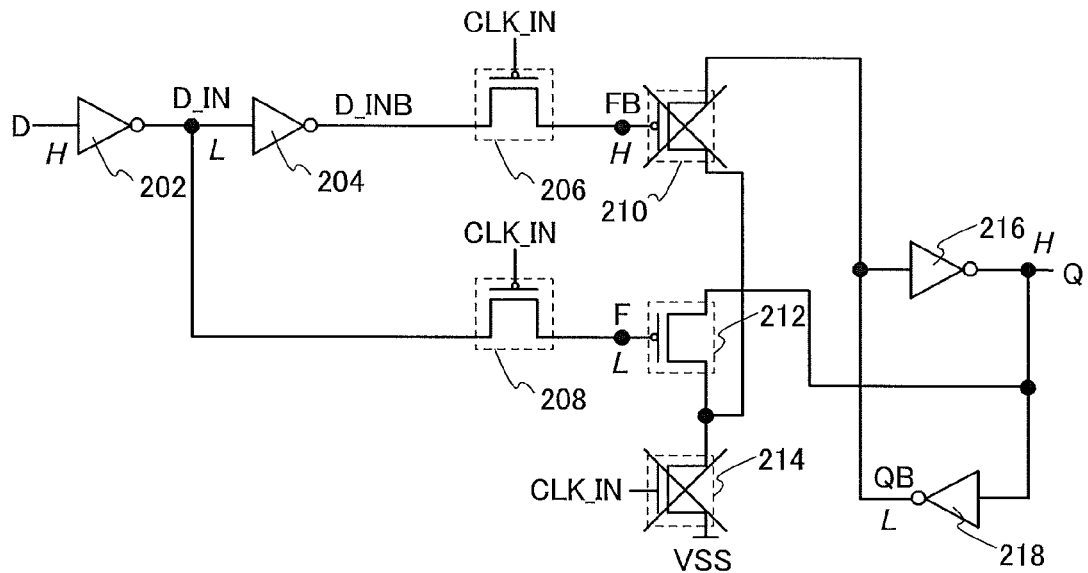
FIGS. 9A and 9B illustrate an operation of a flip-flop circuit in another embodiment of the present invention.
Figure 9B:
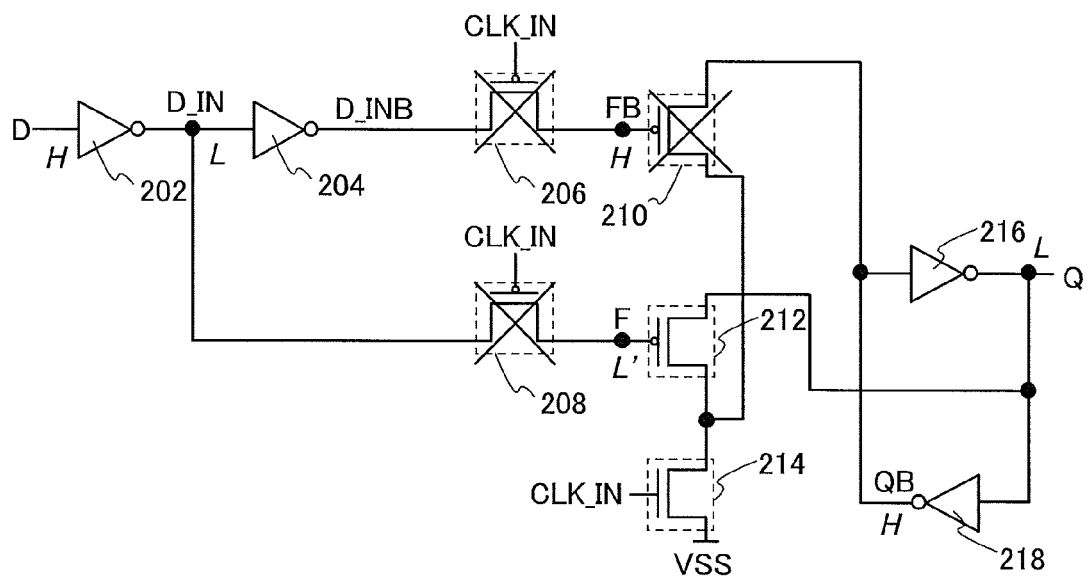
Figure 10:
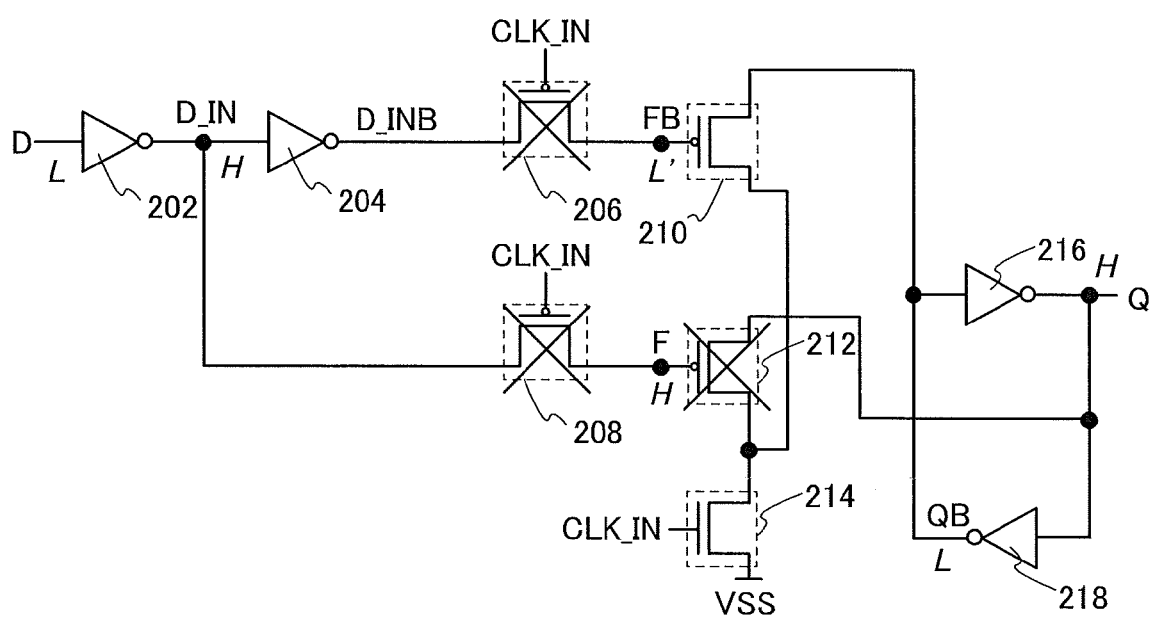
FIG. 10 illustrates an operation of a flip-flop circuit in another embodiment of the present invention.
Figure 11A:
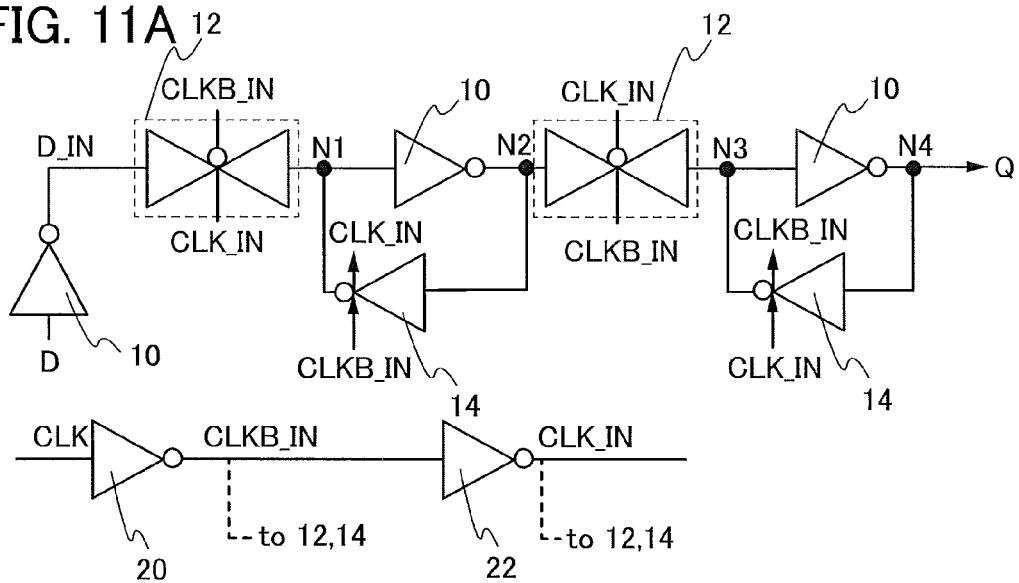
FIGS. 11A to 11D illustrate a conventional flip-flop circuit.
Figure 11B:
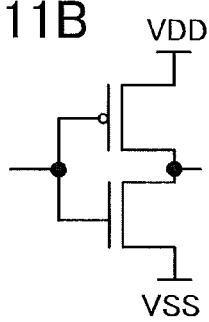
Figure 11C:
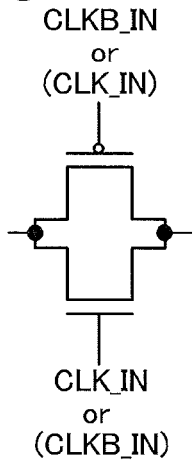
Figure 11D:
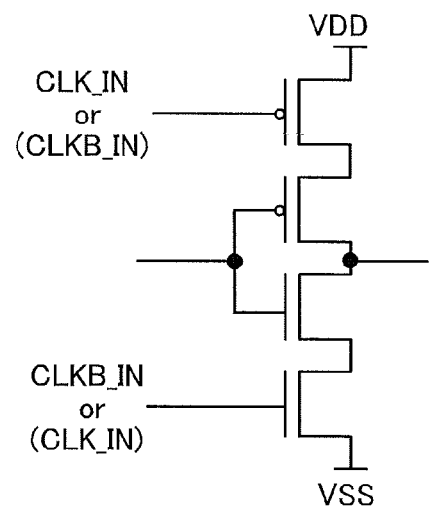

First, the flip-flop circuit 200 is switched from an off state (period t1) to an on state (period t2) (see FIG. 8A).

At this time, the data signal D is at a low level and the inverted signal CLKB of the clock signal is at a high level. When the flip-flop circuit 200 is turned on in this state, a low potential is supplied from the low potential power supply line VSS and the clock signal CLK_IN becomes a low level; accordingly, the transistor 206 and the transistor 208 are turned on.

Further, when a high potential is supplied from the high potential power supply line VDD, the signal D_IN becomes a high level and the signal D_INB becomes a low level. Since the transistor 206 and the transistor 208 are on, the potential of a node F becomes a high level and the potential of a node FB becomes a low level. Accordingly, the transistor 210 is turned on and the transistor 212 is turned off. In the case of the configuration in FIG. 6, the low level potential of the node F (the node FB) is actually higher than the low potential by the threshold voltage of the transistor 208 (the transistor 206). Note that in this embodiment, the threshold voltage of the transistor 208 (the transistor 206) is higher than −1 V.

On the other hand, the transistor 214 is off. In an initial state, a high level signal is output as the signal Q. Note that in a configuration can be employed in which the inverter 216 is replaced with a NAND gate, one of its input terminals is connected to a terminal to which a reset signal is input, and the other of the input terminals is connected to a node QB, which is a node of a wiring to which a signal QB is input. With such a configuration, the signal Q can be forcibly at a high level in the initial state when the reset signal is set to a low level. Alternatively, a configuration can be employed in which the inverter 218 is replaced with a NOR gate, one of its input terminals is connected to a terminal to which a reset signal is input, and the other of the input terminals is connected to a node Q, which is a node of a wiring to which the signal Q is input. With such a configuration, the signal Q can be forcibly at a high level in the initial state when the reset signal is set to a high level. When the reset signal input to the NAND gate is at a high level, the NAND gate operates in a manner similar to that of the inverter 216 and outputs an inverted signal of the signal at the node QB. When the reset signal input to the NOR gate is at a low level, the NOR gate operates in a manner similar to that of the inverter 218 and outputs an inverted signal of the signal at the node Q.

Note that when the signal Q is at a low level in the initial state, the inverter 216 may be replaced with a NOR gate and a high level reset signal may be input to the NOR gate, so that the signal Q is forcibly at a low level in the initial state. Alternatively, the inverter 218 may be replaced with a NAND gate and a low level reset signal may be input to the NAND gate, so that the signal Q is forcibly at a low level in the initial state.

Next, in the period t3 in the processing period, the clock signal CLK_IN is changed from a low level to a high level, so that the transistor 206 and the transistor 208 are turned off and the transistor 214 is turned on.

When the transistor 214 is turned on, current flows from the input terminal of the inverter 216 to the low potential power supply line VSS through the transistor 210, which can change the potential of the input terminal of the inverter 216 to a low level. However, the potential of the input terminal of the inverter 216 has been already a low level; thus, the potential of the input terminal of the inverter 216 is not changed. Thus, the signal Q which is output from the inverter 216 is kept at a high level, and the signal QB which is output from the inverter 218 is kept at a low level (see FIG. 8B).

Next, in the period t4 in the processing period, the clock signal CLK_IN is a low level, the transistor 206 and the transistor 208 are turned on, and the transistor 214 is turned off.

After that, the signal D_IN is changed from a high level to a low level; thus, the potential of the node FB becomes a high level owing to the inverter 204, and the potential of the node F becomes a low level. Accordingly, the transistor 210 is turned off and the transistor 212 is turned on. Since the transistor 214 is off, the signal Q (high level) and the signal QB (low level) are not changed (see FIG. 9A).

Then, in the period t5 in the processing period, the clock signal CLK_IN is changed from a low level to a high level, so that the transistor 206 and the transistor 208 are turned off and the transistor 214 is turned on.

When the transistor 214 is turned on, current flows from the input terminal the inverter 218 to the low potential power supply line VSS through the transistor 212, and the potential of the input terminal of the inverter 218 is changed to a low level. When the low level potential is input to the input terminal of the inverter 218, the signal QB at a high level is output from the output terminal of the inverter 218. The signal QB is input to the input terminal of the inverter 216, and the signal Q at a low level is output from the output terminal of the inverter 216 (see FIG. 9B).

The transistor 208 is off and the node F is in a floating state when the signal Q is changed from a high level to a low level;

thus, the potential of the node F becomes voltage lower than the low potential (1 V) (the voltage is −2 V here, and denoted by L' in the drawing) with the gate capacitance of the transistor 212 by an influence of a change in the signal Q from a high level to a low level. The lower the potential of the node F becomes as described above, the lower the voltage can be applied to the gate of the transistor 212; thus, a larger amount of current can flow from the input terminal of the inverter 218 to the low potential power supply line VSS. As a result, the signal Q can be surely changed from a high level to a low level.

Next, in the period t6 in the processing period, the clock signal CLK_IN is a low level, the transistor 206 and the transistor 208 are turned on, and the transistor 214 is turned off. In addition, the potential of the node FB is at a high level and the potential of the node F is at a low level at this time. After that, the signal D_IN is changed from a low level to a high level; thus, the potential of the node FB becomes a low level owing to the inverter 204, and the potential of the node F becomes a high level. Accordingly, the transistor 210 is turned on and the transistor 212 is turned off. Further, the clock signal CLK_IN is changed from a low level to a high level, so that the transistor 206 and the transistor 208 are turned off and the transistor 214 is turned on (see FIG. 10).

When the transistor 214 is turned on, current flows from the input terminal of the inverter 216 to the low potential power supply line VSS through the transistor 210, and the potential of the input terminal of the inverter 216 is changed to a low level. Then, the signal Q at a high level is output from the output terminal of the inverter 216.

The transistor 206 is off and the node FB is in a floating state when the signal QB is changed from a high level to a low level; thus, the potential of the node FB becomes lower than the low potential (1 V) (the voltage is −2 V here, and denoted by L' in the drawing) with the gate capacitance of the transistor 210 by an influence of a change in the signal QB from a high level to a low level. As described above, the lower the potential of the node FB becomes, the lower the voltage can be applied to the gate of the transistor 210; thus, a larger amount of current can flow from the input terminal of the inverter 216 to the low potential power supply line VSS. As a result, the signal QB can be surely changed from a high level to a low level.

With such a configuration, the inverted signal of the clock signal CLK_IN can be unnecessary. The flip-flop circuit 200 in this embodiment can operate only with the clock signal CLK_IN and the number of transistors that operate only with the clock signal CLK_IN in the flip-flop circuit 200 can be reduced. Thus, the area occupied by the flip-flop circuit can be reduced. In addition, since the number of transistors can be reduced, power consumption of the whole flip-flop circuit can be reduced.

The structure, method, and the like in this embodiment can be combined as appropriate with any of the structures, methods, and the like in the other embodiments.

Embodiment 3

In this embodiment, the case where an oxide semiconductor film is included in each of the transistor 106 and the transistor 108 in Embodiment 1 will be described as an example.

A transistor having an extremely low off-state current (leakage current) per channel width of lower than or equal to $1\times10^{-19}$ A/μm can be used as the transistor 106 and the transistor 108. An example of such a transistor is a transistor including an oxide semiconductor, which is a wide band gap semiconductor, in a channel region. With the use of such a transistor, even when power supply to the flip-flop circuit is stopped in the processing period, the potentials (data) of the node F and the node FB can be held for a long time by turning off the transistor. In other words, the node F and the node FB each can serve as a data holding portion. Further, when power supply to the flip-flop circuit is resumed, the processing can be resumed with the potentials (data) held in the node F and the node FB. Furthermore, power consumption can be suppressed until power supply to the flip-flop circuit is resumed.

Note that for the transistor in which the off-state current per channel width is lower than or equal to $1\times10^{-19}$ A/μm, a semiconductor material which has a band gap larger than that of silicon can also be used. A semiconductor material having a band gap greater than or equal to 2 eV, preferably greater than or equal to 2.5 eV, further preferably greater than or equal to 3 eV may be used.

Figure 12:
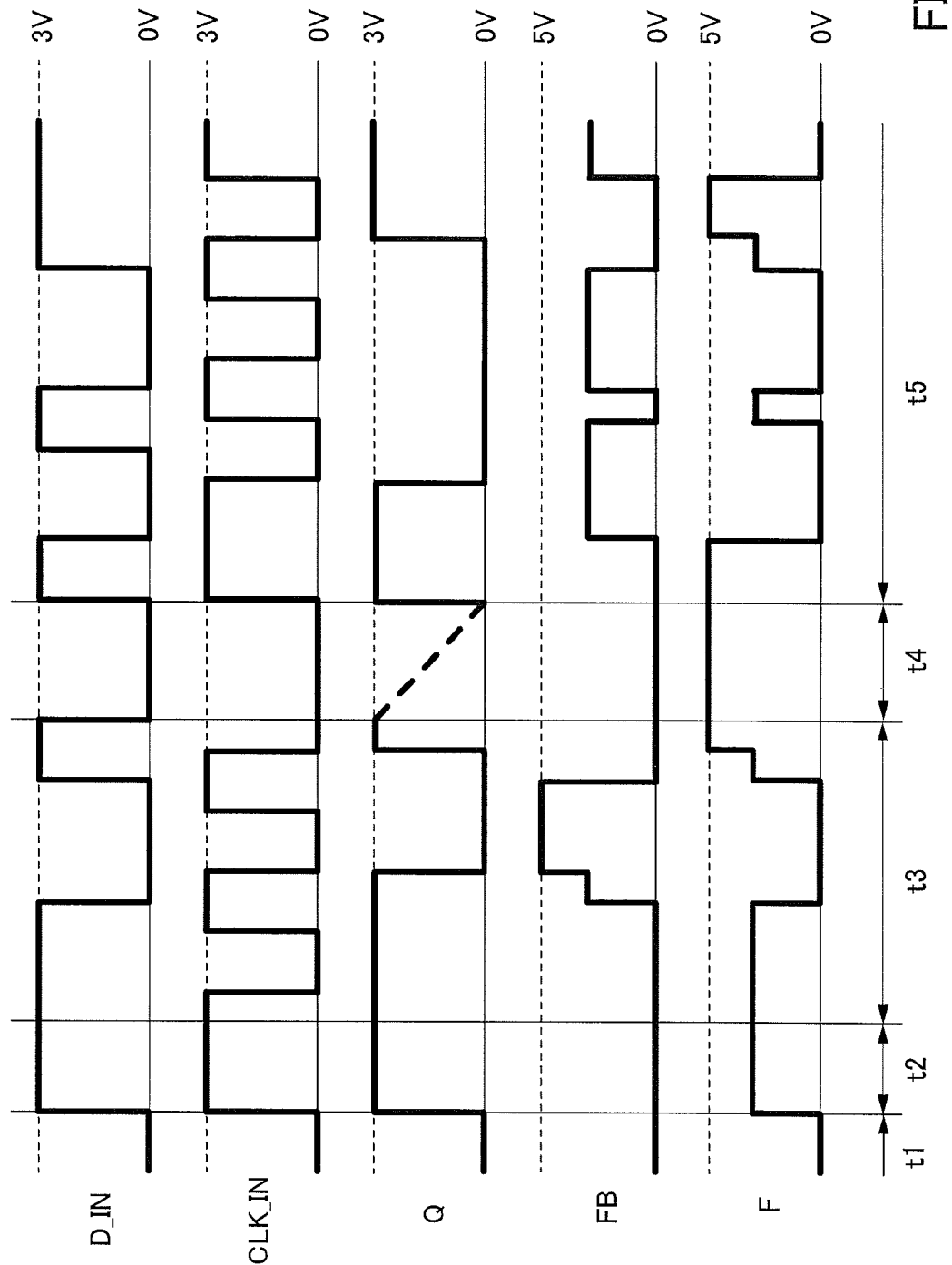
FIG. 12 is a timing chart illustrating an operation of a flip-flop circuit in one embodiment of the present invention.

Next, the operation of the flip-flop circuit 100 will be described with reference to FIG. 12. FIG. 12 is a timing chart illustrating the operation of the flip-flop circuit 100 in which the transistor 106 and the transistor 108 each include an oxide semiconductor film.

Here, the timing chart in FIG. 12 is described. FIG. 12 illustrates five periods t1 to t5. The period t1 is an off period, the period t2 is a starting period, the period t3 is a processing period, the period t4 is an off period, and the period t5 is a processing period (including a restarting period).

The periods t1 to t3 are similar to the periods t1 to t6 in Embodiment 1. In the period t4 that is the off period, power supply to the flip-flop circuit 100 is stopped. The clock signal CLK_IN is set to a low level before power supply is stopped, whereby the transistor 106 and the transistor 108 each including an oxide semiconductor in a channel region are turned off and the potentials of the node F and the node FB can be held.

In the period t5, a processing period follows the restarting period and operations similar to those in the periods t2 and t3 are performed.

With such a configuration, even when power supply to the flip-flop circuit is stopped in the processing period, the potentials of the node F and the node FB can be held for a long time by turning off the transistor. Thus, when power supply to the flip-flop circuit is resumed, the processing can be resumed with the potentials (data) held in the node F and the node FB. Further, power consumption can be suppressed until power supply to the flip-flop circuit is resumed.

The structure, method, and the like in this embodiment can be combined as appropriate with any of the structures, methods, and the like in the other embodiments.

Embodiment 4

In this embodiment, an example of the structure of a transistor having a small off-state current (leakage current) per channel width will be described with reference to a schematic cross-sectional view in FIG. 14.

Figure 14:
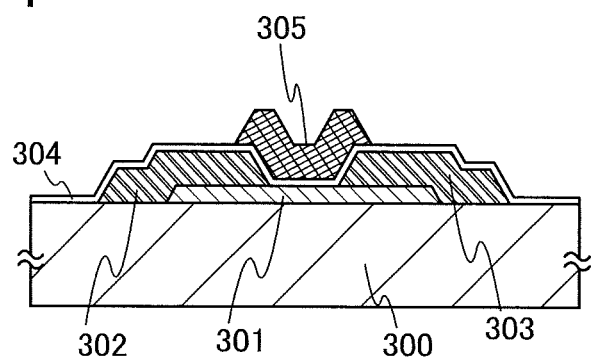
FIG. 14 is a cross-sectional view illustrating a transistor.

FIG. 14 illustrates a structural example of a transistor whose channel formation region is formed in an oxide semiconductor film. The transistor illustrated in FIG. 14 includes an oxide semiconductor film 301 over a film 300 having an insulating surface; a conductive film 302 in contact with one end of the oxide semiconductor film 301; a conductive film 303 in contact with the other end of the oxide semiconductor film 301; an insulating film 304 over the oxide semiconductor film 301, the conductive film 302, and the conductive film 303; and a conductive film 305 over the insulating film 304. Note that in the transistor illustrated in FIG. 14, the conductive film 302 and the conductive film 303 serve as a source and a drain, the insulating film 304 serves as a gate insulating film, and the conductive film 305 serves as a gate.

<1. Specific Example of Oxide Semiconductor Film 301>
<(1) Oxide Semiconductor Material>

A film containing at least indium can be used as the oxide semiconductor film 301. In particular, a film containing indium and zinc is preferably used. As a stabilizer for reducing variations in electrical characteristics of the transistor, a film containing gallium in addition to indium and zinc is preferably used.

Alternatively, a film which contains, as a stabilizer, one or more of tin, hafnium, aluminum, zirconium, and lanthanoid such as lanthanum, cerium, praseodymium, neodymium, samarium, europium, gadolinium, terbium, dysprosium, holmium, erbium, thulium, ytterbium, or lutetium can be used as the oxide semiconductor film 301.

For the oxide semiconductor film 301, for example, a thin film of any of the following can be used: indium oxide, an In—Zn-based oxide, an In—Mg-based oxide, an In—Ga-based oxide, an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Here, for example, an In—Ga—Zn-based oxide means an oxide whose main components are In, Ga, and Zn, and there is no limitation on the ratio of In, Ga, and Zn. The In—Ga—Zn-based oxide may contain a metal element other than In, Ga, and Zn.

Note that part of oxygen included in the oxide semiconductor film 301 may be substituted with nitrogen.

<(2) Crystal Structure of Oxide Semiconductor>

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle ($2\theta$) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when $2\theta$ is around 56°. This peak is derived from the (110) plane of the $InGaZnO_4$ crystal. Here, analysis ($\phi$ scan) is performed under conditions where the sample is rotated around a normal vector of a sample surface as an axis ($\phi$ axis) with $2\theta$ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when 0 scan is performed with $2\theta$ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appear at around 31° and a peak of $2\theta$ do not appear at around 36°.

In a transistor using the CAAC-OS film, change in electric characteristics due to irradiation with visible light or ultraviolet light is small. Thus, the transistor has high reliability.

<(3) Layer Structure of Oxide Semiconductor>

As the oxide semiconductor film 301, not only a single-layer oxide semiconductor film but also a stack of plural kinds of oxide semiconductor films can be used. For example, a layer including at least two of an amorphous oxide semiconductor film, a polycrystalline oxide semiconductor film, and a CAAC-OS film can be used as the oxide semiconductor film 301.

Alternatively, a stack of oxide semiconductor films having different compositions can be used as the oxide semiconductor film 301. Specifically, a layer including a first oxide semiconductor film (hereinafter also referred to as an upper layer) which is provided on the insulating film 304 side and a second oxide semiconductor film (hereinafter also referred to as a lower layer) which is provided on the film 300 having an insulating surface side and has a composition different from that of the first oxide semiconductor film can be used as the oxide semiconductor film 301.

<2. Specific Example of Conductive Films 302 and 303>

For the conductive films 302 and 303, a film containing an element selected from aluminum, copper, titanium, tantalum, tungsten, molybdenum, chromium, neodymium, and scandium, a film of an alloy containing any of these elements, a film of a nitride containing any of these elements, or the like can be used. Alternatively, a stack of these films can be used.

<3. Specific Example of Insulating Film 304>

As the insulating film 304, an inorganic insulating material film such as a silicon oxide film, a silicon nitride film, a silicon oxynitride film, a silicon nitride oxide film, an aluminum oxide film, an aluminum oxynitride film, or a gallium oxide film can be used. Alternatively, a stack of any of these films can be used. Note that an aluminum oxide film is preferably used as the insulating film 304. An aluminum oxide film has a high shielding (blocking) effect of preventing penetration of oxygen and an impurity such as hydrogen. Thus, when the layer including an aluminum oxide film is used as the insulating film 304, it is possible to prevent release of oxygen from the oxide semiconductor film 301 and entry of an impurity such as hydrogen into the oxide semiconductor film 301.

As the insulating film 304, a film including a hafnium oxide film, an yttrium oxide film, a hafnium silicate ($HfSi_xO_y$ (x>0, y>0)) film, a hafnium silicate film to which nitrogen is added, a hafnium aluminate ($HfAl_xO_y$ (x>0, y>0)) film, a lanthanum oxide film (i.e., a film formed of what is called a high-k material), or the like can be used. The use of such a film can reduce a gate leakage current.

<4. Specific Example of Conductive Film 305>

As the conductive film 305, a film containing an element selected from aluminum, copper, titanium, tantalum, tungsten, molybdenum, chromium, neodymium, and scandium or a film of an alloy containing any of these elements as its component can be used. Alternatively, a metal oxide film containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used as the conductive film 305. Such a nitride film has a work function of 5 eV (electron volts) or higher, preferably 5.5 eV or higher. When this film is used for the gate, the threshold voltage of a transistor can be shifted in a positive direction; thus, what is called a normally-off switching element can be provided. Alternatively, a stack of these films can be used.

<5. Supplementary Note>

In the transistor in FIG. 14, it is preferable to inhibit entry of impurities into the oxide semiconductor film 301 and release of constituent elements of the oxide semiconductor film 301. This is because the electrical characteristics of the transistor are changed when such a phenomenon occurs. As a means for inhibiting this phenomenon, insulating layers having a high blocking effect are provided above and below the transistor (between the film 300 having an insulating surface and the transistor, and over the insulating film 304 and the conductive film 305). For example, the insulating layers can be formed using an inorganic insulating material film such as a silicon oxide film, a silicon nitride film, a silicon oxynitride film, a silicon nitride oxide film, an aluminum oxide film, an aluminum oxynitride film, or a gallium oxide film. Alternatively, a stack of layers of these materials can be used.

A semiconductor device which operates as in any of the examples of the circuit operation in the above embodiments can have an extremely small leakage current between power lines and an extremely small off-state current with the use of the transistor described in this embodiment. Accordingly, power consumption of the semiconductor device described in this embodiment can be reduced.

The structure, method, and the like in this embodiment can be combined as appropriate with any of the structures, methods, and the like in the other embodiments.

Embodiment 5

In this embodiment, examples of a structure and a manufacturing method of a semiconductor device including a transistor 902 whose channel formation region is formed in an oxide semiconductor film and a transistor 901 whose channel formation region is formed in a single crystal silicon wafer are described with reference to FIG. 15. Note that a p-channel transistor, an n-channel transistor, or the like can be used as the transistor 901, and a transistor including an oxide semiconductor film can be used as the transistor 902.

Figure 15:
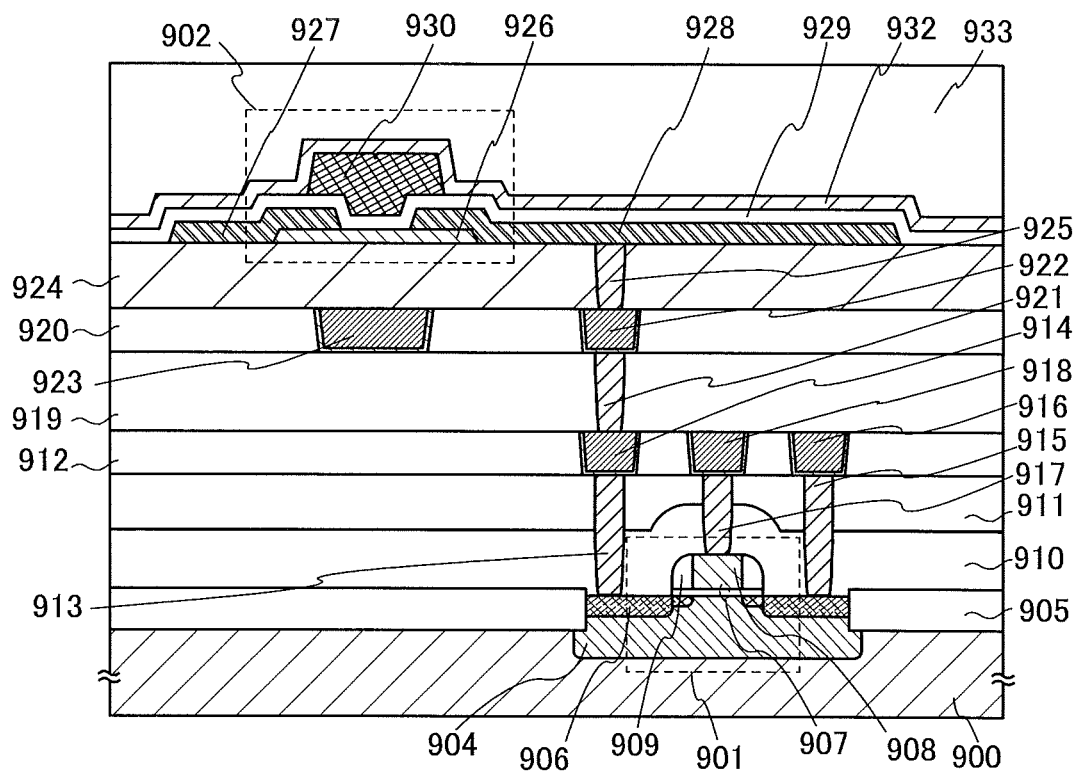
FIG. 15 is a cross-sectional view illustrating a semiconductor device.

In a semiconductor device in FIG. 15, the transistor 901 using a single crystal silicon wafer is formed, and the transistor 902 including an oxide semiconductor is Banned above the transistor 901. In other words, the semiconductor device in this embodiment has a three-dimensional layered structure in which a silicon wafer is used as a substrate and a transistor tier is provided above the silicon wafer. Further, the semiconductor device in this embodiment is a hybrid semiconductor device including a transistor in which silicon is used for a channel formation region and a transistor in which an oxide semiconductor is used for a channel formation region.

Either an n-channel transistor or a p-channel transistor can be used as the transistor 901 formed using a substrate 900 containing a semiconductor material. In the example illustrated in FIG. 15, the transistor 901 is electrically isolated from other elements by a shallow trench isolation (STI) 905. In the substrate 900 where the transistor 901 is formed, a well 904 to which an impurity imparting conductivity, such as boron, phosphorus, or arsenic, is added is formed.

The transistor 901 in FIG. 15 includes a channel formation region in the substrate 900, impurity regions 906 (also referred to as a source region and a drain region) provided so that the channel formation region is sandwiched therebetween, an insulating film 907 serving as a gate insulating film over the channel formation region, and a conductive film 908 serving as a gate provided over the insulating film 907 so as to overlap with the channel formation region. The material, the number of stacked layers, the shape, and the like of the insulating film 907 and the conductive film 908 can be decided as appropriate in accordance with required specifications.

A contact plug 913 and a contact plug 915 are connected to the impurity regions 906 in the substrate 900. Further, a contact plug 917 is connected to the conductive film 908. Here, the contact plugs 913 and 915 also serve as a source electrode and a drain electrode of the transistor 901 to which the contact plugs 913 and 915 are connected. In addition, impurity regions that are different from the impurity regions 906 and serve as LDD regions or extension regions are provided between the impurity regions 906 and the channel formation region. Insulating films 909 serving as sidewalls are provided on side surfaces of the conductive film 908. Owing to the insulating films 909, the LDD regions or the extension regions can be formed.

The transistor 901 is covered with an insulating film 910. The insulating film 910 can serve as a protective film and can prevent impurities from entering the channel formation region from the outside. An insulating film 911 whose surface is flattened by chemical mechanical polishing (CMP) is provided over the insulating film 910.

A tier including the transistor 902 whose channel formation region is formed in an oxide semiconductor film is formed above a tier including the transistor 901. The transistor 902 is a top-gate transistor. The transistor 902 includes a conductive film 927 and a conductive film 928 that are in contact with side surfaces and an upper surface of an oxide semiconductor film 926 and serve as a source electrode and a drain electrode, and a conductive film 930 that serves as a gate electrode over an insulating film 929 that serves as a gate insulating film and is provided over the oxide semiconductor film 926 and the conductive films 927 and 928. An insulating film 932 and an insulating film 933 are formed to cover the transistor 902. Here, a method for forming the transistor 902 is described below.

The oxide semiconductor film 926 is formed over an insulating film 924 serving as a film having an insulating surface. The insulating film 924 can be formed using an inorganic insulating film of silicon oxide, silicon nitride, silicon nitride oxide, silicon oxynitride, aluminum oxide, aluminum nitride, aluminum nitride oxide, or the like. In this embodiment, the insulating film 924 is a stack of a silicon oxide film with a thickness of about 300 nm on a 50-nm-thick aluminum oxide film.

The oxide semiconductor film 926 can be formed by processing an oxide semiconductor film formed over the insulating film 924 into a desired shape. The thickness of the oxide semiconductor film is greater than or equal to 2 nm and less than or equal to 200 nm, preferably greater than or equal to 3 nm and less than or equal to 50 nm, further preferably greater than or equal to 3 nm to and less than or equal to 20 nm. The oxide semiconductor film is deposited by sputtering using an oxide semiconductor target. Further, the oxide semiconductor film can be formed by sputtering under a rare gas (e.g., argon) atmosphere, an oxygen atmosphere, or a mixed atmosphere of a rare gas (e.g., argon) and oxygen. In this embodiment, a 30-nm-thick In—Ga—Zn-based oxide semiconductor thin film obtained by sputtering using a target containing indium (In), gallium (Ga), and zinc (Zn) is used for the oxide semiconductor film 926.

In this embodiment, the oxide semiconductor film is deposited in such a manner that the substrate is held in a treatment chamber kept in a reduced pressure state, moisture remaining in the treatment chamber is removed, a sputtering gas from which hydrogen and moisture are removed is introduced, and the target is used. The substrate temperature may be higher than or equal to 100° C. and lower than or equal to 600° C., preferably higher than or equal to 200° C. and lower than or equal to 400° C. in deposition. By deposition of the oxide semiconductor film while the substrate is heated, the concentration of impurities contained in the deposited oxide semiconductor film can be lowered. In addition, damage by sputtering can be reduced. In order to remove moisture remaining in the treatment chamber, an adsorption vacuum pump is preferably used. For example, a cryopump, an ion pump, or a titanium sublimation pump is preferably used. A hydrogen atom, a compound containing a hydrogen atom, such as water ($H_2O$), and the like are exhausted from the treatment chamber with the use of a cryopump. Thus, the concentration of impurities contained in the oxide semiconductor film deposited in the treatment chamber can be lowered.

Note that in order that hydrogen, a hydroxyl group, and moisture be contained in the oxide semiconductor film 926 as little as possible, it is preferable that an impurity such as hydrogen or moisture that is adsorbed on the substrate 900 be released and exhausted by preheating of the substrate 900 over which the insulating film 924 is formed in a preheating chamber of a sputtering apparatus, as pretreatment for deposition. The temperature of the preheating is higher than or equal to 100° C. and lower than or equal to 400° C., preferably higher than or equal to 150° C. and lower than or equal to 300° C. As an exhaustion means provided in the preheating chamber, a cryopump is preferable. Note that the preheating treatment can be skipped.

Note that etching for forming the oxide semiconductor film 926 may be dry etching, wet etching, or both dry etching and wet etching. As an etching gas used for dry etching, a gas containing chlorine (a chlorine-based gas such as chlorine (OA boron trichloride ($BCl_3$), silicon tetrachloride ($SiCl_4$), or carbon tetrachloride ($CCl_4$)) is preferably used. As the dry etching, parallel plate reactive ion etching (RIE) or inductively coupled plasma (ICP) etching can be used.

Note that the oxide semiconductor deposited by sputtering or the like contains a large amount of moisture or hydrogen (including a hydroxyl group) as an impurity in some cases. Moisture or hydrogen easily forms a donor level and thus serve as an impurity in the oxide semiconductor. Thus, in this embodiment, in order to reduce impurities such as moisture or hydrogen in the oxide semiconductor (in order to perform dehydration or dehydrogenation), the oxide semiconductor film 926 is subjected to heat treatment in a reduced pressure atmosphere; an inert gas atmosphere of nitrogen, a rare gas, or the like; an oxygen gas atmosphere; or ultra dry air (the moisture amount is 20 ppm (−55° C. by conversion into a dew point) or less, preferably 1 ppm or less, further preferably 10 ppb or less, in the case where measurement is performed by a dew point meter in a cavity ring-down laser spectroscopy (CRDS) method).

By performing heat treatment on the oxide semiconductor film 926, moisture or hydrogen in the oxide semiconductor film 926 can be released. Specifically, heat treatment may be performed at a temperature higher than or equal to 250° C. and lower than or equal to 750° C., preferably higher than or equal to 400° C. and lower than the strain point of the substrate. For example, heat treatment may be performed at 500° C. for approximately 3 to 6 minutes. When RTA is used for the heat treatment, dehydration or dehydrogenation can be performed in a short time; thus, the heat treatment can be performed even at a temperature higher than the strain point of a glass substrate.

In the heat treatment, it is preferable that moisture, hydrogen, and the like be not contained in nitrogen or a rare gas such as helium, neon, or argon. Alternatively, the purity of nitrogen or a rare gas such as helium, neon, or argon which is introduced into the heat treatment apparatus is preferably 6N (99.9999%) or higher, further preferably 7N (99.99999%) or higher (that is, the impurity concentration is 1 ppm or lower, preferably 0.1 ppm or lower).

Through the above steps, the concentration of hydrogen in the oxide semiconductor film 926 can be lowered and the oxide semiconductor film 926 can be highly purified. Accordingly, the oxide semiconductor film can be stabilized. Further, with the use of the highly purified oxide semiconductor film in which the hydrogen concentration is lowered, it is possible to form a transistor with high withstand voltage and an extremely low off-state current.

Next, the conductive films 927 and 928 serving as a source electrode and a drain electrode are formed by a photolithography process. Specifically, the conductive films 927 and 928 can be formed in such a manner that a conductive film is formed over the insulating film 924 by sputtering or vacuum vapor deposition and then processed (patterned) into a predetermined shape. In this embodiment, a 100-nm-thick tungsten film is used for the conductive films 927 and 928.

Note that the material and etching conditions of the conductive film and the oxide semiconductor film 926 are decided as appropriate so that removal of the oxide semiconductor film 926 is prevented as much as possible when the conductive film is etched. Depending on the etching conditions, an exposed portion of the oxide semiconductor film 926 is partly etched and as a result, a groove (a depression portion) is formed in some cases.

Next, plasma treatment is performed using a gas such as $N_2O$, $N_2$, or Ar. With this plasma treatment, water and the like attached to a surface of the oxide semiconductor film exposed are removed. Alternatively, plasma treatment may be performed using a mixed gas of oxygen and argon. After the plasma treatment, the insulating film 929 serving as a gate insulating film is formed to cover the conductive films 927 and 928 and the oxide semiconductor film 926. Then, over the insulating film 929, the conductive film 930 serving as a gate electrode is formed to overlap with the oxide semiconductor film 926.

In this embodiment, a 20-nm-thick silicon oxynitride film formed by sputtering is used as the insulating film 929. The substrate temperature in deposition is in the range of room temperature to 400° C., and is 300° C. in this embodiment.

After the insulating film 929 is formed, heat treatment may be performed. The heat treatment is preferably performed at higher than or equal to 200° C. and lower than or equal to 400° C., for example, higher than or equal to 250° C. and lower than or equal to 350° C. in a nitrogen atmosphere, ultra-dry air, or a rare gas (e.g., argon or helium) atmosphere. It is preferable that the content of water in the gas be 20 ppm or lower, preferably 1 ppm or lower, further preferably 10 ppb or lower.

Alternatively, oxygen vacancies that serve as donors in the oxide semiconductor film 926 may be reduced by performing heat treatment on the oxide semiconductor film 926 in an oxygen atmosphere so that oxygen is added to the oxide semiconductor. The heat treatment is performed at, for example, higher than or equal to 100° C. and lower than 350° C., preferably higher than or equal to 150° C. and lower than 250° C.

The conductive film 930 can be formed in such a manner that a conductive film is formed over the insulating film 929 and then is patterned.

The thickness of the conductive film 930 is greater than or equal to 10 nm and less than or equal to 400 nm, preferably greater than or equal to 100 nm and less than or equal to 300 nm. In this embodiment, the conductive film 930 is formed in the following manner a 135-nm-thick tungsten film is stacked over a 30-nm-thick tantalum nitride film by sputtering to form a conductive film used for the gate electrode, and then, the conductive film is processed (patterned) into a desired shape by etching.

Through the above steps, the transistor 902 is formed.

Note that in this embodiment, the transistor 902 has a top-gate structure. The transistor 902 includes a conductive film 923 serving as a back gate electrode. In the case where the transistor 902 includes a back gate electrode, the transistor 902 can be surely a normally-off transistor. For example, when the potential of the conductive film 923 is set at GND or a fixed potential, the threshold voltage of the transistor 902 can be further shifted in a positive direction, and the transistor 902 can have more excellent normally-off characteristics.

To electrically connect the transistor 901 to the transistor 902 to form an electric circuit, one or more wiring layers for connecting these elements are stacked between tiers.

In FIG. 15, one of a source and a drain of the transistor 901 is connected to the conductive film 928 of the transistor 902 through the contact plug 913, a wiring layer 914, a contact plug 921, a wiring layer 922, and a contact plug 925. The other of the source and the drain of the transistor 901 is connected to a wiring layer 916 through the contact plug 915. A gate of the transistor 901 is connected to the wiring layer 918 through the contact plug 917.

The wiring layers 914, 916, 918, and 922 and the conductive film 923 serving as a back gate electrode are embedded in insulating films. These wiring layers and the like are preferably formed using a low-resistance conductive material such as copper or aluminum. With the use of such a low-resistance conductive material, RC delay of signals transmitted through the wiring layers can be reduced. When copper is used for the wiring layers, a barrier film is formed to prevent copper from diffusing into the channel formation region. The barrier film can be a tantalum nitride film, a stack of a tantalum nitride film and a tantalum film, a titanium nitride film, or a stack of a titanium nitride film and a titanium film, for example.

An insulating film 911, an insulating film 912, an insulating film 919, an insulating film 920, and the insulating film 933 can be formed using an insulator such as silicon oxide, silicon oxynitride, silicon nitride oxide, borophosphosilicate glass (BPSG), phosphosilicate glass (PSG), silicon oxide to which carbon is added (SiOC), silicon oxide to which fluorine is added (SiOF), silicon oxide made from $Si(OC_2H_5)_4$ (tetraethylorthosilicate: TEOS), hydrogen silsesquioxane (HSQ), methyl silsesquioxane (MSQ), organosilicate glass (OSG), or an organic polymer-based material. The insulating films are formed by sputtering, CVD, a coating method including spin coating (also referred to as spin on glass (SOG)), or the like.

An insulating film serving as an etching stopper for flattening treatment by CMP or the like may be additionally provided after the wiring material is embedded in the insulating films 911, 912, 919, 920, and 933.

Each of the contact plugs 913, 915, 917, 921, and 925 is formed in such a manner that an opening (a via hole) with a high aspect ratio is formed in the insulating film and is filled with a conductive material such as tungsten. The opening is preferably formed by highly anisotropic dry etching. In particular, reactive ion etching (RIE) is preferably used. A barrier film (a diffusion prevention film) that is a titanium film, a titanium nitride film, a stack of such films, or the like is formed on an inner wall of the opening and a material such as tungsten or polysilicon doped with phosphorus or the like fills the opening.

A semiconductor device which operates as in any of the examples of the circuit operation in the above embodiments can have an extremely small leakage current between power lines and an extremely small off-state current with the use of the transistor described in this embodiment. Accordingly, power consumption of the semiconductor device described in this embodiment can be reduced. When transistors whose semiconductor layers are formed using different materials are provided in different tiers, the transistors can overlap with each other. Thus, the circuit area of the semiconductor device can be reduced, so that the semiconductor device can be downsized.

The structure, method, and the like in this embodiment can be combined as appropriate with any of the structures, methods, and the like in the other embodiments.

This application is based on Japanese Patent Application serial no. 2012-199419 filed with Japan Patent Office on Sep. 11, 2012, the entire contents of which are hereby incorporated by reference.

What is claimed is:

1. A circuit comprising:
    a first terminal;
    a first inverter, a second inverter, a third inverter and a fourth inverter;
    a first transistor, a second transistor, a third transistor, a fourth transistor, and a fifth transistor; and
    a second terminal,
    wherein the first terminal is electrically connected to an input terminal of the first inverter,
    wherein an output terminal of the first inverter is electrically connected to an input terminal of the second inverter and one of a source and a drain of the second transistor,
    wherein an output terminal of the second inverter is electrically connected to one of a source and a drain of the first transistor,
    wherein the other of the source and the drain of the first transistor is electrically connected to a gate of the fourth transistor,
    wherein the other of the source and the drain of the second transistor is electrically connected to a gate of the fifth transistor,
    wherein one of a source and a drain of the third transistor is electrically connected to a power supply line,
    wherein the other of the source and the drain of the third transistor is electrically connected to one of a source and a drain of the fourth transistor and one of a source and a drain of the fifth transistor,
    wherein the other of the source and the drain of the fourth transistor is electrically connected to an input terminal of the third inverter and an output terminal of the fourth inverter, and
    wherein the other of the source and the drain of the fifth transistor is electrically connected to the second terminal, an output terminal of the third inverter, and an input terminal of the fourth inverter.

2. The circuit according to claim 1, further comprising a fifth inverter and a third terminal,
    wherein the third terminal is electrically connected to an input terminal of the fifth inverter, and
    wherein an output terminal of the fifth inverter is electrically connected to a gate of the first transistor, a gate of the second transistor, and a gate of the third transistor.

3. The circuit according to claim 1, wherein a gate of the first transistor, a gate of the second transistor, and a gate of the third transistor are configured to be supplied with a clock signal.

4. The circuit according to claim 1, wherein a polarity of the third transistor is different from polarities of the first transistor, the second transistor, the fourth transistor, and the fifth transistor.

5. The circuit according to claim 1, wherein each of the first transistor and the second transistor is a transistor including an oxide semiconductor in a channel region.

6. A semiconductor device comprising the circuit according to claim 1.

7. A circuit comprising:
    a first terminal;
    a first inverter, a second inverter, a third inverter and a fourth inverter;
    a first transistor, a second transistor, a third transistor, a fourth transistor, and a fifth transistor; and
    a second terminal,
    wherein the first terminal is electrically connected to an input terminal of the first inverter,
    wherein an output terminal of the first inverter is electrically connected to an input terminal of the second inverter and one of a source and a drain of the second transistor,
    wherein an output terminal of the second inverter is electrically connected to one of a source and a drain of the first transistor,
    wherein the other of the source and the drain of the first transistor is electrically connected to a gate of the fourth transistor,
    wherein the other of the source and the drain of the second transistor is electrically connected to a gate of the fifth transistor,
    wherein one of a source and a drain of the third transistor is electrically connected to a power supply line,
    wherein the other of the source and the drain of the third transistor is electrically connected to one of a source and a drain of the fourth transistor and one of a source and a drain of the fifth transistor,
    wherein the other of the source and the drain of the fourth transistor is electrically connected to an input terminal of the third inverter and an output terminal of the fourth inverter,
    wherein the other of the source and the drain of the fifth transistor is electrically connected to the second terminal, an output terminal of the third inverter, and an input terminal of the fourth inverter,
    wherein each of the first transistor, the second transistor, the fourth transistor, and the fifth transistor is an n-channel transistor, and
    wherein the third transistor is a p-channel transistor.

8. The circuit according to claim 7, further comprising a fifth inverter and a third terminal,
   wherein the third terminal is electrically connected to an input terminal of the fifth inverter, and
   wherein an output terminal of the fifth inverter is electrically connected to a gate of the first transistor, a gate of the second transistor, and a gate of the third transistor.

9. The circuit according to claim 7, wherein a gate of the first transistor, a gate of the second transistor, and a gate of the third transistor are configured to be supplied with a clock signal.

10. The circuit according to claim 7, wherein each of the first transistor and the second transistor is a transistor including an oxide semiconductor in a channel region.

11. The circuit according to claim 7, wherein the power supply line is supplied with a high power source potential.

12. A semiconductor device comprising the circuit according to claim 7.

13. A circuit comprising:
   a first terminal;
   a first inverter, a second inverter, a third inverter, and a fourth inverter;
   a first transistor, a second transistor, a third transistor, a fourth transistor, and a fifth transistor; and
   a second terminal,
   wherein the first terminal is electrically connected to an input terminal of the first inverter,
   wherein an output terminal of the first inverter is electrically connected to an input terminal of the second inverter and one of a source and a drain of the second transistor,
   wherein an output terminal of the second inverter is electrically connected to one of a source and a drain of the first transistor,
   wherein the other of the source and the drain of the first transistor is electrically connected to a gate of the fourth transistor,
   wherein the other of the source and the drain of the second transistor is electrically connected to a gate of the fifth transistor,
   wherein one of a source and a drain of the fourth transistor is electrically connected to one of a source and a drain of the third transistor and one of a source and a drain of the fifth transistor,
   wherein the other of the source and the drain of the third transistor is electrically connected to a power supply line,
   wherein the other of the source and the drain of the fourth transistor is electrically connected to an input terminal of the third inverter and an output terminal of the fourth inverter,
   wherein the other of the source and the drain of the fifth transistor is electrically connected to the second terminal, an output terminal of the third inverter, and an input terminal of the fourth inverter,
   wherein each of the first transistor, the second transistor, the fourth transistor, and the fifth transistor is a p-channel transistor, and
   wherein the third transistor is an n-channel transistor.

14. The circuit according to claim 13, further comprising a fifth inverter and a third terminal,
   wherein the third terminal is electrically connected to an input terminal of the fifth inverter, and
   wherein an output terminal of the fifth inverter is electrically connected to a gate of the first transistor, a gate of the second transistor, and a gate of the third transistor.

15. The circuit according to claim 13, wherein a gate of the first transistor, a gate of the second transistor, and a gate of the third transistor are configured to be supplied with a clock signal.

16. The circuit according to claim 13, wherein each of the first transistor and the second transistor is a transistor including an oxide semiconductor in a channel region.

17. The circuit according to claim 13, wherein the power supply line is supplied with a high power source potential.

18. A semiconductor device comprising the circuit according to claim 13.

* * * * *